US012619157B2

(12) United States Patent
Kuo et al.

(10) Patent No.: US 12,619,157 B2
(45) Date of Patent: May 5, 2026

(54) OPTICAL LITHOGRAPHY SYSTEM AND METHOD OF USING THE SAME

(71) Applicant: Taiwan Semiconductor Manufacturing Co., Ltd., Hsinchu (TW)

(72) Inventors: Hung-Jui Kuo, Hsinchu (TW); Ting-Yang Yu, Hsinchu (TW); Ming-Tan Lee, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/733,146

(22) Filed: Jun. 4, 2024

(65) Prior Publication Data

US 2024/0319609 A1     Sep. 26, 2024

Related U.S. Application Data

(60) Continuation of application No. 18/065,391, filed on Dec. 13, 2022, now Pat. No. 12,032,295, which is a (Continued)

(51) Int. Cl.
*G03F 7/00* (2006.01)
*G03F 1/46* (2012.01)
(Continued)

(52) U.S. Cl.
CPC ............ *G03F 7/70191* (2013.01); *G03F 1/46* (2013.01); *H01L 21/4853* (2013.01); *H01L 21/4857* (2013.01); *H01L 21/561* (2013.01);

*H01L 21/568* (2013.01); *H01L 24/82* (2013.01); *H01L 24/97* (2013.01); *H01L 25/105* (2013.01)

(58) Field of Classification Search
CPC .... G03F 7/70191; G03F 1/46; G03F 7/70166; G03F 7/707; G03F 7/70783; G03F 7/70766; G03F 7/70716; H01L 21/4853; H01L 21/4857; H01L 21/561; H01L 21/568; H01L 24/82; H01L 24/97; H01L 25/105; H01L 23/49816; H01L 25/50; H01L 2225/1035; H01L 2225/1058; H01L 24/18; H01L 23/3128; H01L 23/5389; H01L 2221/68327; H01L 2221/68345;
(Continued)

(56) References Cited

U.S. PATENT DOCUMENTS 4,705,956 A     11/1987   Ward
5,029,222 A      7/1991   Yamada et al.
(Continued)

FOREIGN PATENT DOCUMENTS

EP           0312653 A1     4/1989
JP       2008098325 A   *  4/2008   ........... H01L 21/027

*Primary Examiner* — Hung V Nguyen
(74) *Attorney, Agent, or Firm* — Slater Matsil, LLP

(57) ABSTRACT

In an embodiment, an apparatus includes an energy source, a support platform for holding a wafer, an optical path extending from the energy source to the support platform, and a photomask aligned such that a patterned major surface of the photomask is parallel to the force of gravity, where the optical path passes through the photomask, where the patterned major surface of the photomask is perpendicular to a topmost surface of the support platform.

20 Claims, 16 Drawing Sheets

Related U.S. Application Data division of application No. 17/371,204, filed on Jul. 9, 2021, now Pat. No. 11,960,211.

(51) Int. Cl.

| | |
|---|---|
| *H01L 21/48* | (2006.01) |
| *H01L 21/56* | (2006.01) |
| *H01L 23/00* | (2006.01) |
| *H01L 25/10* | (2006.01) |

(58) Field of Classification Search

CPC . H01L 2221/68354; H01L 2221/68359; H01L 21/6835

See application file for complete search history.

(56) References Cited

U.S. PATENT DOCUMENTS

| | | | |
|---|---|---|---|
| 5,741,576 A * | 4/1998 | Kuo | G03F 1/62 |
| | | | 428/192 |
| 6,061,118 A | 5/2000 | Takeda | |
| 6,391,503 B2 | 5/2002 | Ebihara | |
| 6,416,908 B1 | 7/2002 | Klosner et al. | |
| 6,542,220 B1 * | 4/2003 | Schrijver | G03F 7/70858 |
| | | | 355/75 |
| 6,549,271 B2 | 4/2003 | Yasuda et al. | |
| 6,636,293 B1 | 10/2003 | Shiraishi | |
| 6,721,031 B2 * | 4/2004 | Hasegawa | G03F 7/70933 |
| | | | 355/53 |
| 6,791,661 B2 | 9/2004 | Sato | |
| 7,777,860 B2 | 8/2010 | Jee | |
| 7,839,480 B2 | 11/2010 | Yoo | |
| 8,823,921 B2 | 9/2014 | Zlatanov et al. | |
| 10,268,121 B2 | 4/2019 | Shirato et al. | |
| 11,256,183 B2 | 2/2022 | Lee | |
| 2004/0130696 A1 | 7/2004 | Doros | |
| 2020/0348601 A1 | 11/2020 | Kuo et al. | |

* cited by examiner

OPTICAL LITHOGRAPHY SYSTEM AND METHOD OF USING THE SAME

PRIORITY CLAIM AND CROSS-REFERENCE

This application is a continuation of U.S. application Ser. No. 18/065,391, entitled "Optical Lithography System and Method of Using the Same," filed on Dec. 13, 2022, which is a divisional of U.S. patent application Ser. No. 17/371, 204, entitled "Optical Lithography System and Method of Using the Same," filed on Jul. 9, 2021, now U.S. Pat. No. 11,960,211, issued on Apr. 16, 2024, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
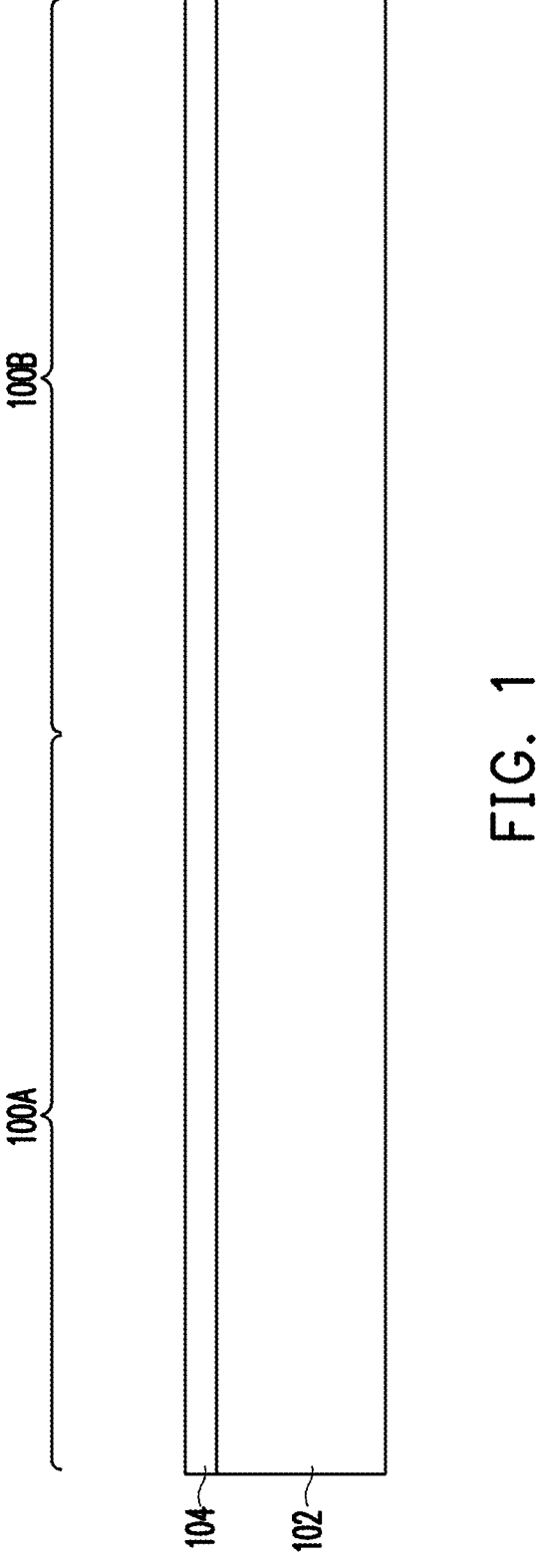
FIGS. 1 through 7 illustrate cross-sectional views of intermediate steps during a process for forming a first package structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved apparatuses for patterning semiconductor devices and semiconductor apparatuses formed using the same. The embodiments of the present disclosure are discussed in the context of providing various configurations of an optical lithography system to support a photomask that is used with the optical lithographic system in order to form semiconductor devices and/or semiconductor packages, such as an integrated Fan-Out (InFO) package. In embodiments, an optical lithography system may include a vertical mask chuck that aligns the photomask such that a patterned major surface of the photomask is parallel to the force of gravity, reducing sagging of the photomask due to gravitational effects. An optical lithography system may include a pressurized chamber below the photomask, which uses gas pressure to tune the photomask surface curvature (e.g., tuning the photomask curvature from concave to convex) and reduce sagging of the photomask due to gravitational effects. An optical lithography system may include a vacuumed chamber above the photomask, which uses a vacuumed environment to tune the photomask surface curvature (e.g., tuning the photomask curvature from concave to convex) and reduce sagging of the photomask due to gravitational effects. In addition, an optical lithography system may include a curved wafer chuck that matches the sagging of the photomask, which reduces image distortion of a projected image on a wafer surface of a wafer that is on the curved wafer chuck. A large photomask may be affected by gravitational effects, resulting in the sagging of the photomask at the mask center. This may have undesirable effects, such as a reduced usable depth of focus and image distortion. All four of these configurations for an optical lithography system help to maintain a uniform depth of focus, and allow for finer, more accurate patterning, which improves device performance and increases yield. In addition, the optical lithography system allows for a large integrated field size during patterning.

FIGS. 1 through 7 and 12 through 15 illustrate cross-sectional views of intermediate steps during a process for forming first packages 200 (see FIG. 14), in accordance with some embodiments. A first package region 100A and a second package region 100B are illustrated, and a first package 200 is formed in each of the first package region 100A and the second package region 100B. The first packages 200 may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV light. The release layer 104 may be dispensed as a liquid and cured, may be a laminate film laminated onto the carrier substrate 102, or may be the like. The top surface of the release layer 104 may be leveled by a planarization process such as chemical mechanical planarization (CMP) and may have a high degree of planarity.

Figure 2:
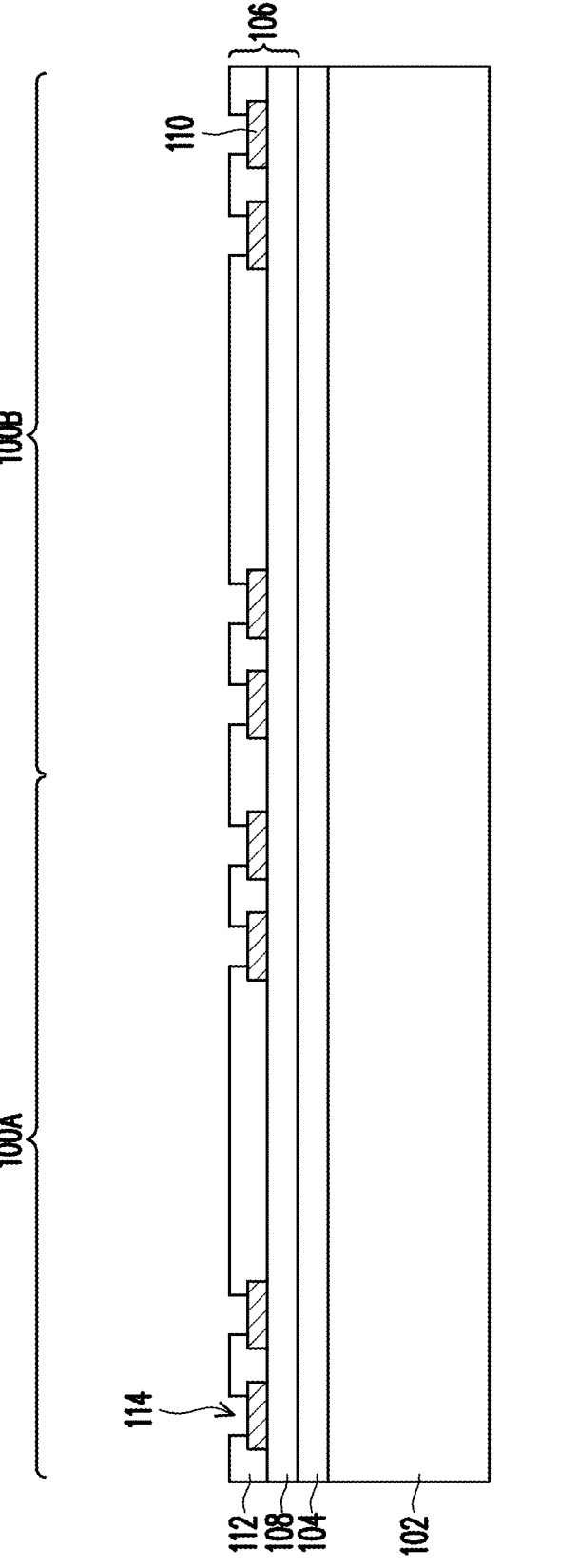

In FIG. 2, a back-side redistribution structure 106 is formed on the release layer 104. In the embodiment shown, the back-side redistribution structure 106 includes a first dielectric layer 108, a first metallization pattern 110 (sometimes referred to as redistribution layers or redistribution lines), and a second dielectric layer 112.

The first dielectric layer 108 is formed on the release layer 104. The bottom surface of the first dielectric layer 108 may be in contact with the top surface of the release layer 104. In some embodiments, the first dielectric layer 108 is formed of a polymer, such as polybenzoxazole (PBO), polyimide, benzocyclobutene (BCB), or the like. In other embodiments, the first dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The first dielectric layer 108 may be formed by any acceptable deposition process, such as spin coating, chemical vapor deposition (CVD), laminating, the like, or a combination thereof.

The first metallization pattern 110 is formed on the first dielectric layer 108. As an example of forming the first metallization pattern 110, a seed layer (not separately illustrated) is formed over the first dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not separately illustrated) is then formed and patterned on the seed layer. The photoresist may be formed by spin coating or the like, may be exposed to patterned light or another patterned energy source, and may be exposed to a developer to remove exposed or unexposed portions of the photoresist. The pattern of the photoresist corresponds to the first metallization pattern 110. The patterning forms openings through the photoresist to expose the seed layer. A conductive material (not separately illustrated) is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are then removed. The photoresist may be removed by an acceptable ashing or stripping process, such as using an oxygen plasma or the like. Once the photoresist is removed, exposed portions of the seed layer are removed using an acceptable etching process such as wet or dry etching. The remaining portions of the seed layer and the conductive material form the first metallization pattern 110.

The second dielectric layer 112 is formed on the first metallization pattern 110 and the first dielectric layer 108. In some embodiments, the second dielectric layer 112 is formed of a polymer, which may be a photo-sensitive material such as PBO, polyimide, BCB, or the like, that may be patterned using a lithography mask. In other embodiments, the second dielectric layer 112 is formed of a nitride such as silicon nitride; an oxide such as silicon oxide, PSG, BSG, BPSG; or the like. The second dielectric layer 112 may be formed by spin coating, lamination, CVD, the like, or a combination thereof. The second dielectric layer 112 is then patterned to form openings 114 exposing portions of the first metallization pattern 110. The patterning may be by an acceptable process, such as by exposing the second dielectric layer 112 to patterned light or another patterned energy source and exposing the second dielectric layer 112 to a developer when the second dielectric layer 112 is a photo-sensitive material or by etching using, for example, an anisotropic etch. In some embodiments, the second dielectric layer 112 is a material with a high coefficient of thermal expansion (CTE), such as a polyimide.

It should be appreciated that the back-side redistribution structure 106 may include any number of dielectric layers and metallization patterns. Additional dielectric layers and metallization patterns may be formed by repeating the processes for forming the first metallization pattern 110 and the second dielectric layer 112. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 3:
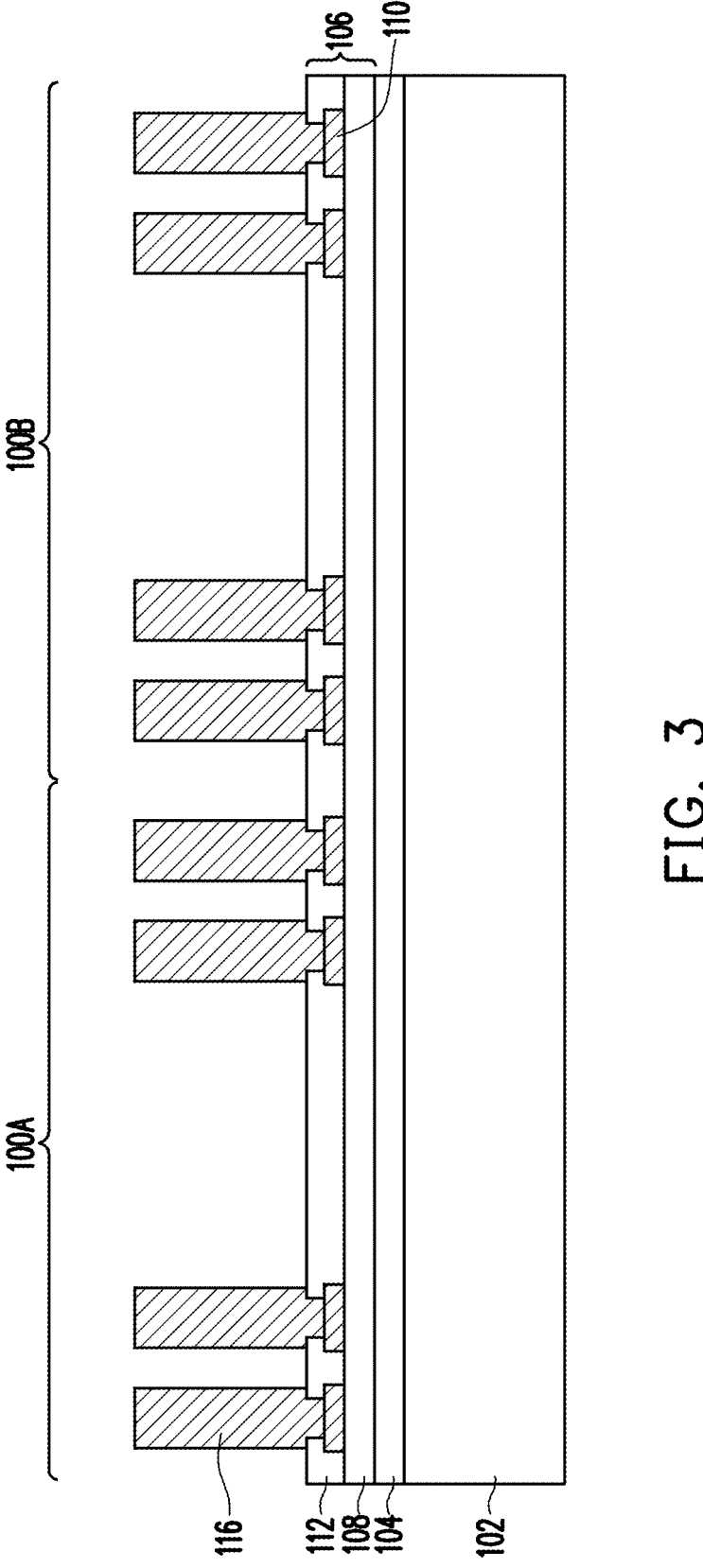

In FIG. 3, through vias 116 are formed in the openings 114, extending away from the second dielectric layer 112. In an embodiment, the through vias 116 may be formed by forming a seed layer (not separately illustrated) over the back-side redistribution structure 106, e.g., on the second dielectric layer 112 and portions of the first metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist (not separately illustrated) is formed and patterned on the seed layer. The photoresist may be formed by spin coating or the like, may be exposed to patterned light or another patterned energy source, and may be exposed to a developer to remove exposed or unexposed portions of the photoresist. The pattern of the photoresist corresponds to the through vias 116. The patterning forms openings through the photoresist to expose the seed layer. A conductive material (not separately illustrated) is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching. The remaining portions of the seed layer and the conductive material form the through vias 116.

Figure 4:
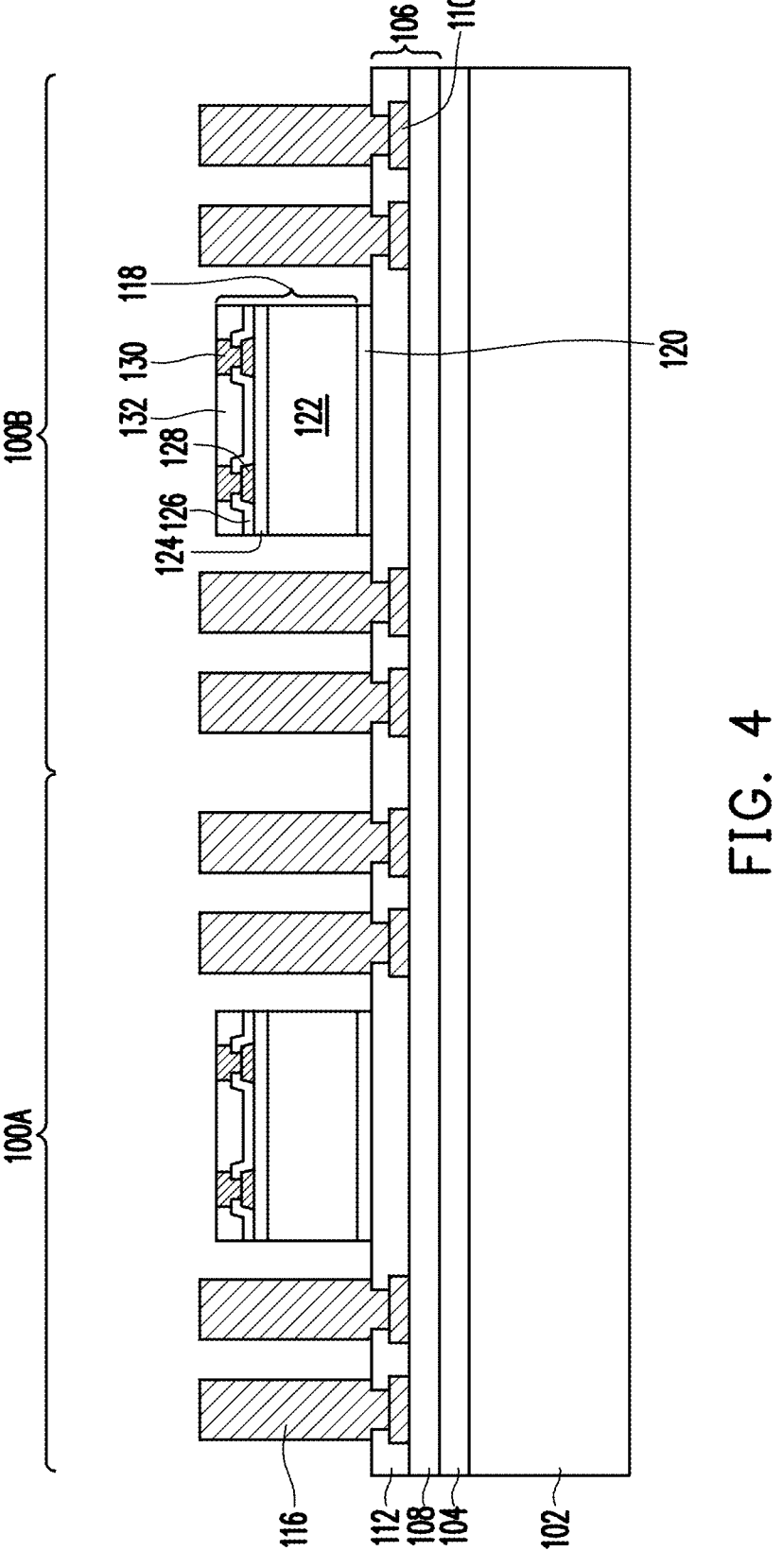

In FIG. 4, integrated circuit dies 118 are adhered to the second dielectric layer 112 by an adhesive 120. The integrated circuit dies 118 may be logic dies (e.g., central processing units, microcontrollers, or the like), memory dies (e.g., dynamic random access memory (DRAM) dies, static random access memory (SRAM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. In some embodiments, the integrated circuit dies 118 may be different sizes (e.g., different heights and/or surface areas), and in other embodiments, the integrated circuit dies 118 may be the same size (e.g., same heights and/or surface areas).

Before being adhered to the second dielectric layer 112, the integrated circuit dies 118 may be processed according to applicable manufacturing processes to form integrated circuits in the integrated circuit dies 118. For example, the integrated circuit dies 118 each include a semiconductor substrate 122, such as silicon, doped or undoped, or an active layer of a semiconductor-on-insulator (SOI) substrate. The semiconductor substrate 122 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 122 and may be interconnected by interconnect structures 124 formed by, for example, metallization patterns in one or more dielectric layers on the semiconductor substrate 122 to form an integrated circuit.

The integrated circuit dies 118 further comprise pads 128, such as aluminum pads, to which external connections are made. The pads 128 are on what may be referred to as respective active sides of the integrated circuit dies 118. Passivation films 126 are on the integrated circuit dies 118 and on portions of the pads 128. Openings extend through the passivation films 126 to the pads 128. Die connectors 130, such as conductive pillars (e.g., comprising a metal such as copper), extend through the openings in the passivation films 126 and are mechanically and electrically coupled to the respective pads 128. The die connectors 130 may be formed by, for example, plating, or the like. The die connectors 130 electrically couple the respective integrated circuits of the integrated circuit dies 118.

A dielectric material 132 is on the active sides of the integrated circuit dies 118, such as on the passivation films 126 and the die connectors 130. The dielectric material 132 laterally encapsulates the die connectors 130, and the dielectric material 132 is laterally coterminous with the respective integrated circuit dies 118. The dielectric material 132 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 120 is on back-sides of the integrated circuit dies 118 and adheres the integrated circuit dies 118 to the back-side redistribution structure 106, such as the second dielectric layer 112. The adhesive 120 may be any suitable adhesive, epoxy, die attach film (DAF), or the like. The adhesive 120 may be applied to a back-side of the integrated circuit dies 118 or may be applied over the surface of the carrier substrate 102. For example, the adhesive 120 may be applied to the back-side of the integrated circuit dies 118 before the integrated circuit dies 118 are singulated into individual dies.

Although one integrated circuit die 118 is illustrated as being adhered in each of the first package region 100A and the second package region 100B, it should be appreciated that more integrated circuit dies 118 may be adhered in each of the first package region 100A and the second package region 100B. For example, multiple integrated circuit dies 118 may be adhered in the first package region 100A and the second package region 100B. Further, the integrated circuit dies 118 may vary in size. In some embodiments, the integrated circuit dies 118 may be dies with a large footprint, such as system-on-chip (SoC) devices. In embodiments where the integrated circuit dies 118 have a large footprint, the space available for the through vias 116 in the first package region 100A and the second package region 100B may be limited. Use of the back-side redistribution structure 106 allows for an improved interconnect arrangement when the package regions have limited space available for the through vias 116.

Figure 5:
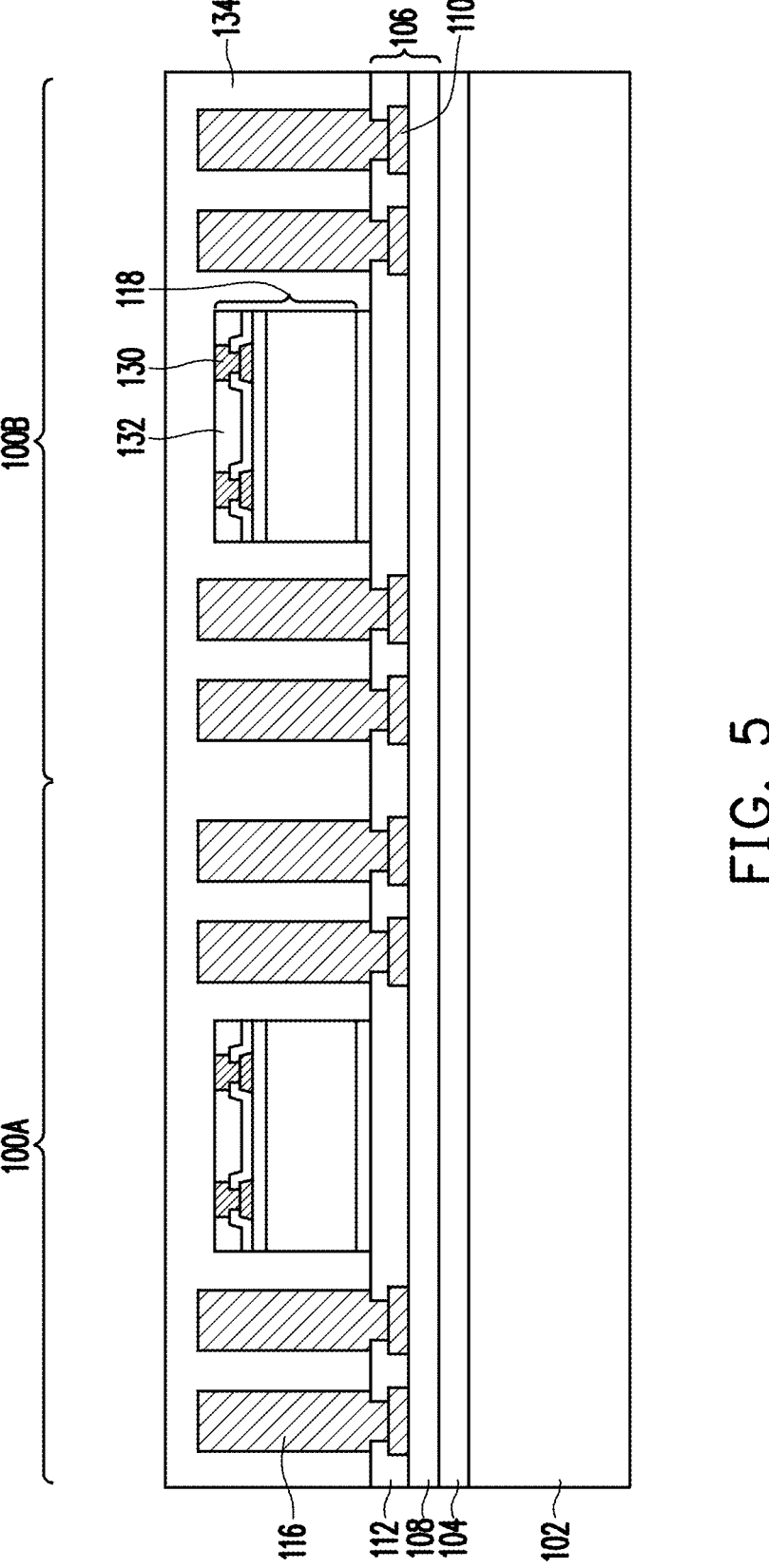

In FIG. 5, an encapsulant 134 is formed over the back-side redistribution structure 106, the integrated circuit dies 118, and the through vias 116. As illustrated in FIG. 5, after formation, the encapsulant 134 laterally encapsulates the through vias 116 and the integrated circuit dies 118. The encapsulant 134 may be a molding compound, epoxy, or the like. The encapsulant 134 may have a coefficient of thermal expansion (CTE) that is similar to the CTE of the second dielectric layer 112, which may reduce CTE mismatch, reducing warpage. The encapsulant 134 may be applied by compression molding, transfer molding, or the like, and may be formed over the carrier substrate 102 such that the through vias 116 and/or the integrated circuit dies 118 are buried or covered. The encapsulant 134 is then cured.

Figure 6:
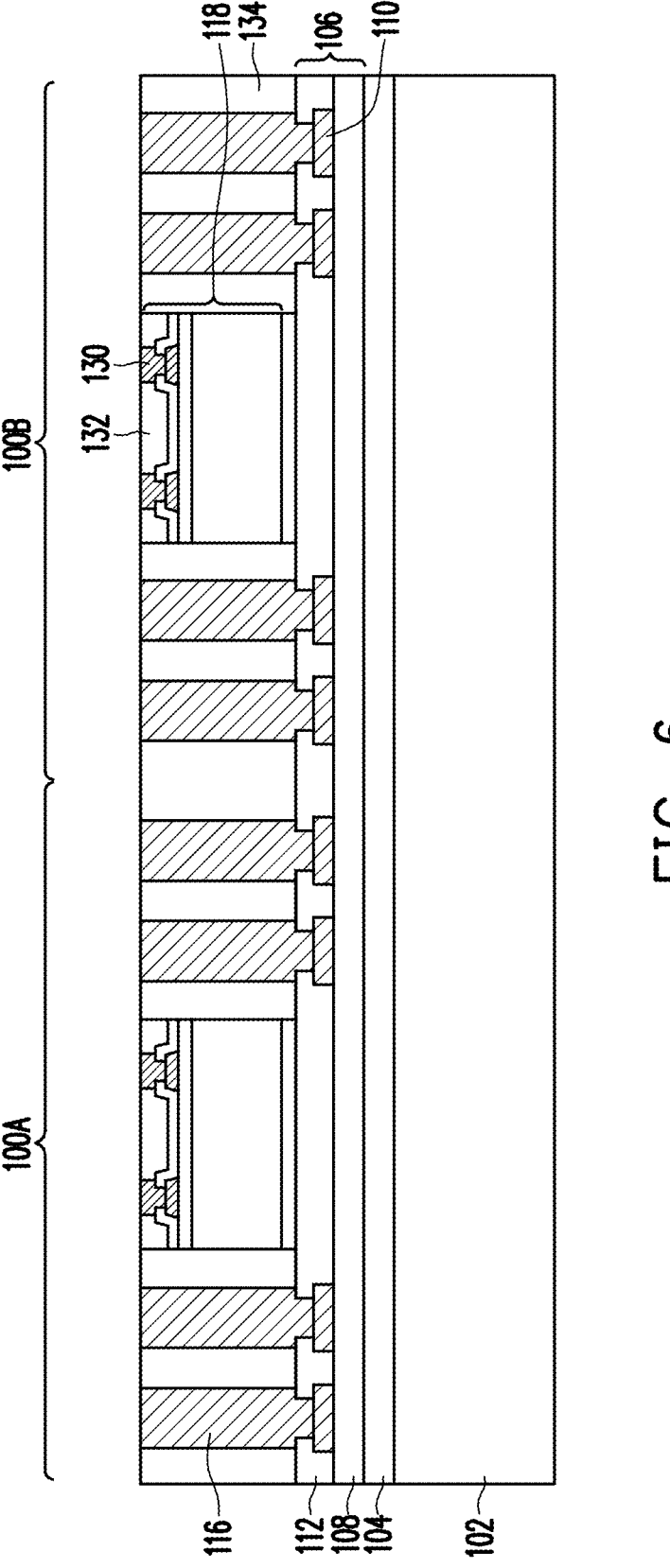

In FIG. 6, a planarization process is performed on the encapsulant 134 to expose the through vias 116 and the die connectors 130. The planarization process may also grind the dielectric material 132. Following the planarization process, top surfaces of the through vias 116, the die connectors 130, the encapsulant 134, and the dielectric material 132 may be level with one another. The planarization process may be, for example, a CMP process, a grinding process, or the like. In some embodiments, the planarization may be omitted, for example, if the through vias 116 and the die connectors 130 are already exposed.

Figure 7:
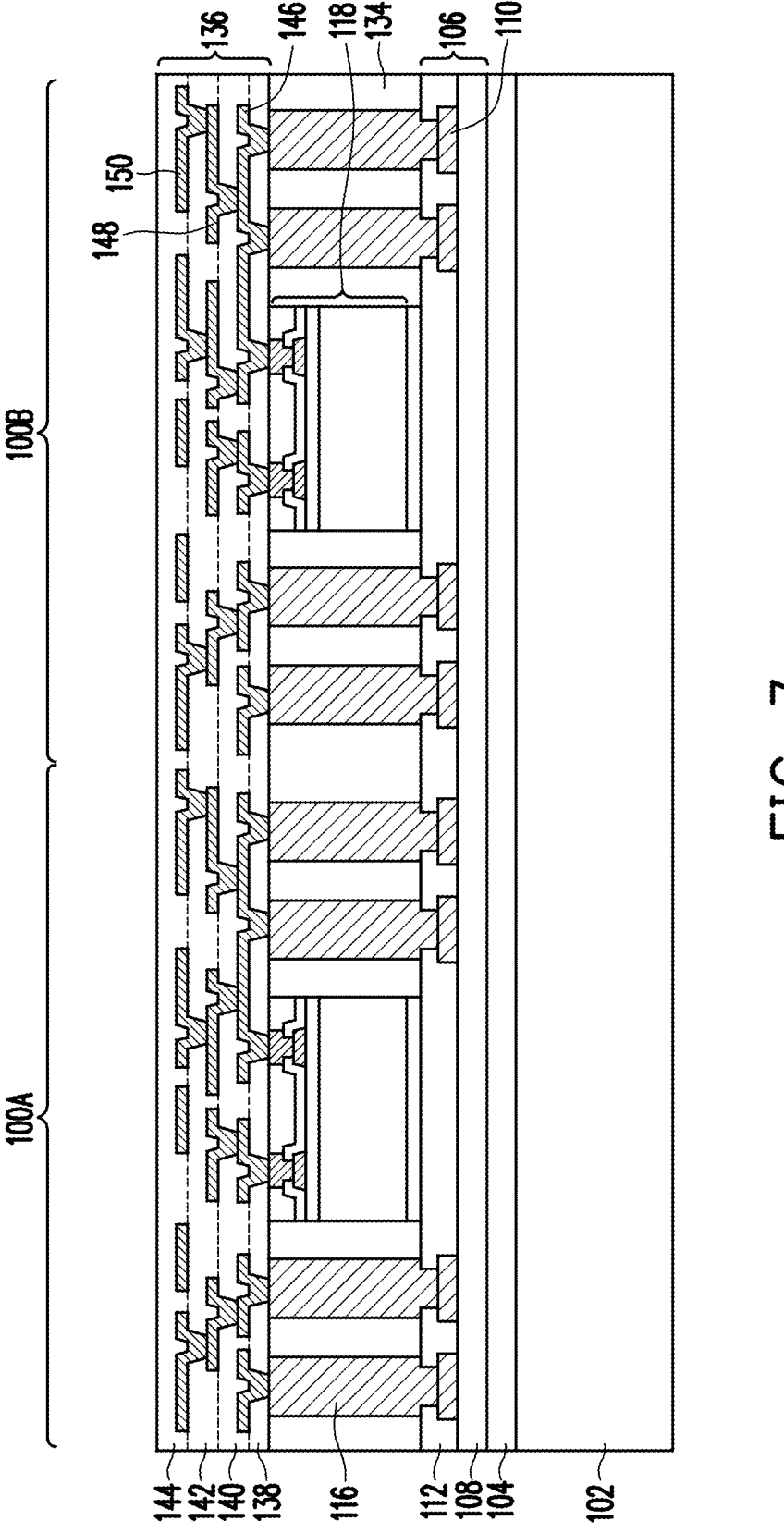

In FIG. 7, a front-side redistribution structure 136 is formed over the through vias 116, the encapsulant 134, and the integrated circuit dies 118. The front-side redistribution structure 136 includes a third dielectric layer 138, a fourth dielectric layer 140, a fifth dielectric layer 142, and a sixth dielectric layer 144; and a second metallization pattern 146, a third metallization pattern 148, and a fourth metallization pattern 150. The metallization patterns may also be referred to as redistribution layers or redistribution lines.

The front-side redistribution structure 136 is shown as an example. More or fewer dielectric layers and metallization patterns may be formed in the front-side redistribution structure 136. If fewer dielectric layers and metallization patterns are to be formed, steps and processes discussed below may be omitted. If more dielectric layers and metallization patterns are to be formed, steps and processes discussed below may be repeated.

In accordance with an embodiment, the front-side redistribution structure 136 may be formed by first depositing the third dielectric layer 138 on the encapsulant 134, the through vias 116, and the die connectors 130. In some embodiments, the third dielectric layer 138 is formed of a photo-sensitive material such as PBO, polyimide, BCB, or the like, which may be patterned using a lithography mask. The third dielectric layer 138 may be formed by spin coating, lamination, CVD, the like, or a combination thereof. The third dielectric layer 138 is then patterned. The patterning forms openings (subsequently filled by the second metallization pattern 146) exposing portions of the through vias 116 and the die connectors 130. In embodiments in which the third dielectric layer 138 is a photo-sensitive material, the third dielectric layer 138 may be patterned by exposing the third dielectric layer 138 to patterned light or another patterned energy source and exposing the third dielectric layer 138 to a developer to remove exposed or unexposed portions of the third dielectric layer 138.

The second metallization pattern 146 is then formed. The second metallization pattern 146 includes conductive lines which are formed on and extending along a major surface of the third dielectric layer 138. The second metallization pattern 146 further includes conductive vias that extend through the third dielectric layer 138 and are physically and electrically connected to the through vias 116 and the integrated circuit dies 118. The second metallization pattern 146 may be formed by forming a seed layer (not separately illustrated) over the third dielectric layer 138 and in the openings extending through the third dielectric layer 138. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist (not separately illustrated) is then formed and patterned on the seed layer. The photoresist may be formed by spin coating or the like and may be patterned by exposing the photoresist to patterned light or another patterned energy source and exposing the photoresist to a developer to remove exposed or unexposed portions of the photoresist. The pattern of the photoresist corresponds to the second metallization pattern 146. The patterning forms openings through the photoresist to expose the seed layer. A conductive material (not separately illustrated) is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the second metallization pattern 146. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The fourth dielectric layer 140 is deposited on the third dielectric layer 138 and the second metallization pattern 146. The fourth dielectric layer 140 may be formed in a manner similar to the third dielectric layer 138, and may be formed of the same material as the third dielectric layer 138.

The third metallization pattern 148 is then formed. The third metallization pattern 148 includes conductive lines on and extending along the major surface of the fourth dielectric layer 140. The third metallization pattern 148 further includes conductive vias extending through the fourth dielectric layer 140 to be physically and electrically connected to the second metallization pattern 146. The third metallization pattern 148 may be formed in a manner similar to the second metallization pattern 146, and may be formed of the same material as the second metallization pattern 146.

The fifth dielectric layer 142 is deposited on the fourth dielectric layer 140 and the third metallization pattern 148. The fifth dielectric layer 142 may be formed in a manner similar to the third dielectric layer 138, and may be formed of the same material as the third dielectric layer 138.

The fourth metallization pattern 150 is then formed. The fourth metallization pattern 150 includes conductive lines on and extending along the major surface of the fifth dielectric layer 142. The fourth metallization pattern 150 further includes conductive vias extending through the fifth dielectric layer 142 to be physically and electrically connected to the third metallization pattern 148. The fourth metallization pattern 150 may be formed in a manner similar to the second metallization pattern 146, and may be formed of the same material as the second metallization pattern 146.

The sixth dielectric layer 144 is deposited on the fifth dielectric layer 142 and the fourth metallization pattern 150. The sixth dielectric layer 144 may be formed in a manner similar to the third dielectric layer 138, and may be formed of the same material as the third dielectric layer 138.

Figure 8B:
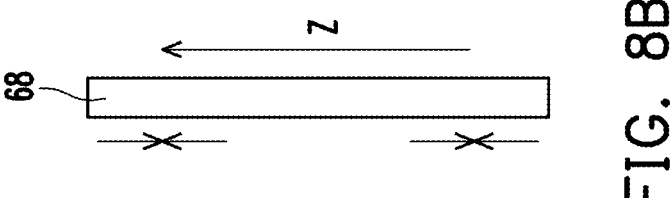
FIGS. 8A through 11 illustrate cross-sectional views of optical lithography systems used to process a first package, in accordance with some embodiments.
Figure 8A:
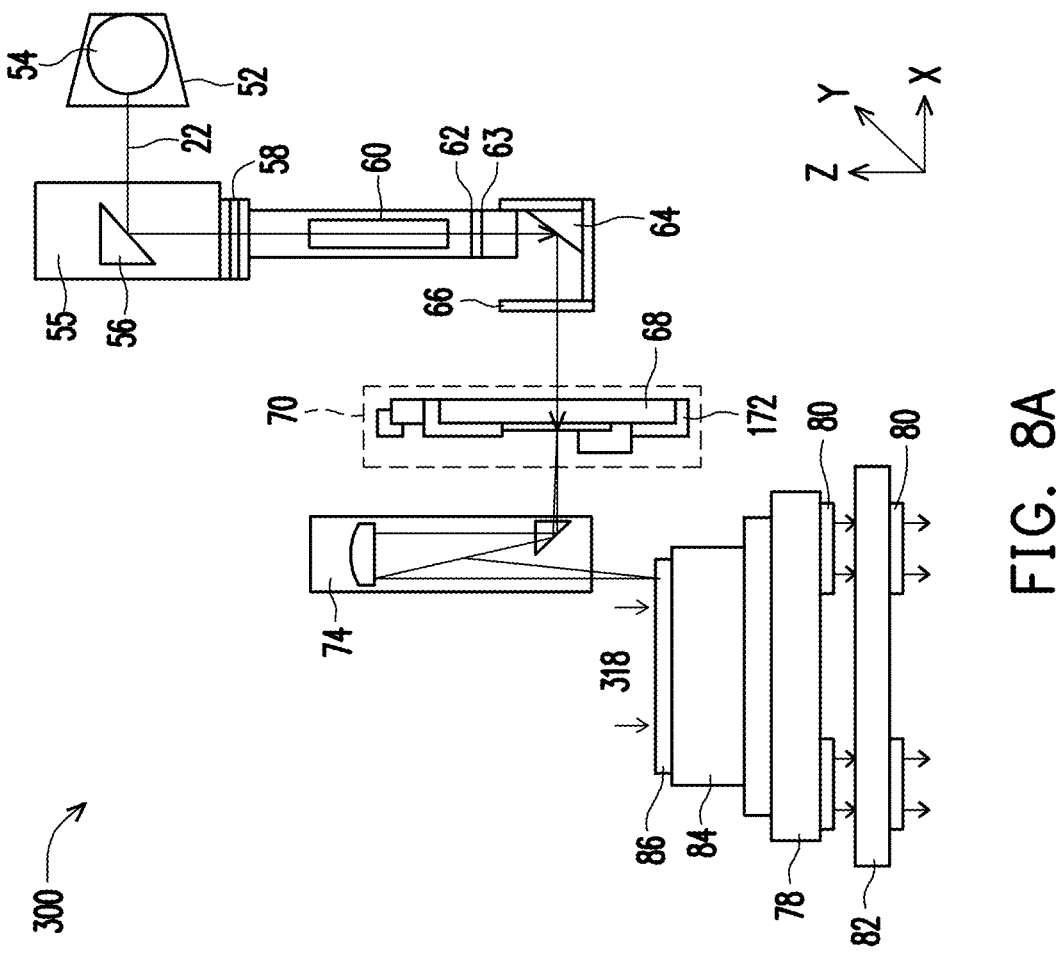

FIGS. 8A-8B illustrate an optical lithography system 300 used to expose the dielectric layers of the front-side redistribution structure 136 (described previously in FIG. 7) and the back-side redistribution structure 106 (described previously in FIG. 2) and the photoresists used to pattern the metallization patterns of the front-side redistribution structure 136 and the back-side redistribution structure 106 to patterned light or other patterned energy sources used for patterning the dielectric layers and the photoresists (collectively referred to as target layers 318). The optical lithography system may be step-and-repeat systems (e.g., steppers), step-and-scan systems (e.g., scanners), or the like. In FIG. 8A, the optical lithography system 300 includes an energy source 54 and an ellipsoidal reflector 52. The optical lithography system 300 may comprise a light pipe 55 that includes a cold mirror 56, a shutter 58, a condenser assembly 60, a filter insertion 62, and an aperture insertion 63. The optical lithography system 300 may also include a turning mirror 64, and an output lens 66.

The energy source 54 supplies energy 22 (for example, in the form of light) which travels along an optical path and may be used to pattern the target layers 318 on a wafer 86. The energy source 54 may be a source of the electromagnetic radiation, such as a mercury lamp (with a wavelength of 365 nm), a KrF excimer laser light (with a wavelength of 248 nm), an ArF excimer laser light (with a wavelength of 193 nm), an $F_2$ excimer laser light (with a wavelength of 157 nm), or the like, although any other suitable source of energy 22, such as xenon lamps, carbon arc lamps or the like, may be utilized. In an embodiment, the energy source 54 supplies energy 22 such as light to the target layers 318 in order to induce a reaction of photoactive compounds (PACs) included in the target layers 318. The chemical reaction products of the PACs' absorption of the energy 22 (e.g., acids, bases, free radicals, and the like) then react, chemically altering the target layer 318 in those portions that were illuminated. The, exposed portions or the unexposed portions of the target layer 318 may be removed by exposing the target layer to a developer solution. In an embodiment the energy 22 may be electromagnetic radiation, such as g-rays (with a wavelength of about 436 nm), i-rays (with a wavelength of about 365 nm), ultraviolet radiation, far ultraviolet radiation, x-rays, electron beams, or the like.

The ellipsoidal reflector 52 is used to collect and direct energy 22 (for example, in the form of light) from the energy source 54 onto the cold mirror 56. The cold mirror 56 directs energy 22 through a light pipe 55 that may be used to transmit or distribute light for the purpose of illumination. The shutter 58 allows a controlled interruption of the energy 22 that passes through the light pipe 55. The condenser assembly 60 has a condenser that renders a divergent beam of energy 22 from a point source (for example, energy source 54) into a parallel or converging beam. The filter insertion 62 allows the insertion of different filters, where each filter corresponds to a different wavelength of light that is to be restricted from passing through the light pipe 55 and on to the photomask 68. The aperture insertion 63 allows the insertion of an aperture, which may have an opening through which light may travel. Different apertures that have openings of different sizes may be used to control the amount of light that passes through the light pipe 55 and on to the photomask 68. The turning mirror 64 directs energy 22 through the output lens 66 and through the photomask 68 (also referred to as a reticle).

The optical lithography system 300 includes a region 70 that comprises a mask chuck 172 and the photomask 68. The photomask 68 (also referred to as a reticle) may be formed from a material such as soda lime. In other embodiments the photomask 68 may be formed from another material such as quartz, or the like. The photomask 68 is located between the energy source 54 and the target layers 318 in order to block portions of the energy 22 to form patterned energy prior to the energy 22 actually impinging upon the target layers 318. In an embodiment the photomask 68 may comprise a series of layers (e.g., substrate, absorbance layers, anti-reflective coating layers, shielding layers, etc.) to reflect, absorb, or otherwise block portions of the energy 22 from reaching those portions of the target layers 318 which are not desired to be illuminated. The desired pattern may be formed in the photomask 68 by forming openings through the photomask 68 in the desired shape of illumination.

The mask chuck 172 may be a vacuum chuck that supports and aligns the photomask 68 vertically such that a patterned major surface of the photomask 68 is parallel to the force of gravity. The energy 22 from the energy source 54 is directed through the photomask 68 by the light pipe 55 and the turning mirror 64 in a direction that is perpendicular to the patterned major surface of the photomask 68. Energy 22 (for example, in the form of light) from the energy source 54 passes through photomask 68, and continues through a lens assembly 74. The lens assembly 74 may be a Wynne-Dyson projection lens with 1:1 imaging optics, or the like. In other embodiments, another type of projection lens may be used. An image of the photomask 68 pattern is then projected on to the target layers 318 on the wafer 86 by the lens assembly 74. The wafer 86 is supported by a wafer chuck 84, which is below the wafer 86.

A depth of focus (DoF) of the lens assembly 74 of the optical lithography system 300 is the vertical distance over which the wafer 86 can be displaced while a single object plane remains in acceptably sharp focus. Because the photomask 68 is aligned vertically such that the patterned major surface of the photomask 68 is parallel to the force of gravity (described subsequently in FIG. 8B), sagging of the photomask at the center of the patterned major surface due to gravitational effects is reduced. As a result, a curvature of the projected image by the lens assembly 74 is reduced which allows for a more uniform depth of focus, reduced image distortion, and for finer, more accurate patterning, which improves device performance, increases yield, and reduces manufacturing costs. If a large photomask (for example, a 14 inch photomask, or the like) is supported only outside of the exposure area in such a way that a patterned major surface of the photomask is perpendicular to the force of gravity, gravitational effects will cause the photomask to bend and sag at the mask center. Sagging may still occur even when the photomask is made from substantially harder materials. When a photomask sags, a projected image by the lens assembly is curved to be a section of a surface of a sphere rather than a plane. This may lead to a reduced usable depth of focus. As a result there may be some defocus and image distortion during patterning, which may result in reduced yield and increased manufacturing costs.

The mask chuck 172 may include a motor and be capable of motion in two linear degrees of freedom (for example, Y and Z directions). In other embodiments, the mask chuck 172 may be capable of motion in three linear degrees of freedom (for example, X, Y, and Z directions). The wafer chuck 84 is supported by a translation stage 82 and a micropositioner 78. The translation stage 82 may include a motor, which allows the translation stage 82 to be movable and capable of motion in two linear degrees of freedom (for example, X and Y directions). In other embodiments, the translation stage 82 may be capable of motion in three linear degrees of freedom (for example, X, Y and Z directions) in addition to allowing rotational movement. The micropositioner 78 allows the wafer chuck 84 to be positioned to finer limits than is possible by only using the translation stage 82 without the micropositioner 78. Translation stage 82 may allow movement by using a method that includes the use of air bearings 80, or the like. In other embodiments, the translation stage 82 may use other methods to allow movement.

FIG. 8B illustrates the vertically aligned photomask 68 (described previously in FIG. 8A). The energy 22 from the energy source 54 is directed through the photomask 68 by the light pipe 55 and the turning mirror 64 in a direction that is perpendicular to the patterned major surface of the photomask 68. Because the photomask 68 is aligned vertically such that the patterned major surface of the photomask 68 is parallel to the force of gravity, sagging at the center of the patterned major surface of the photomask 68 due to gravitational effects is reduced. As a result, a curvature of the projected image by the lens assembly 74 is reduced which allows for a more uniform depth of focus, reduced image distortion, and for finer, more accurate patterning, which improves device performance, increases yield, and reduces manufacturing costs.

Figure 9A:
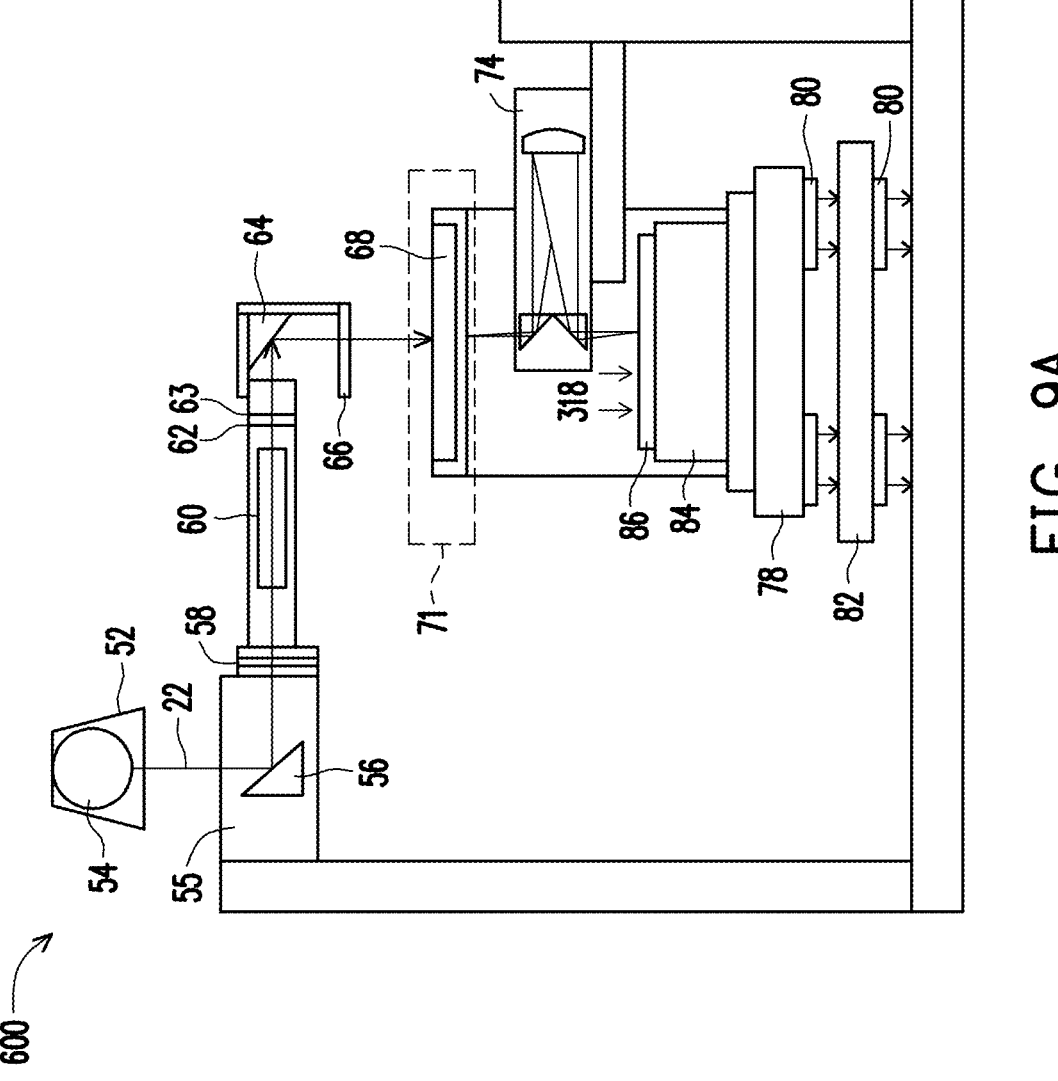
Figure 9B:
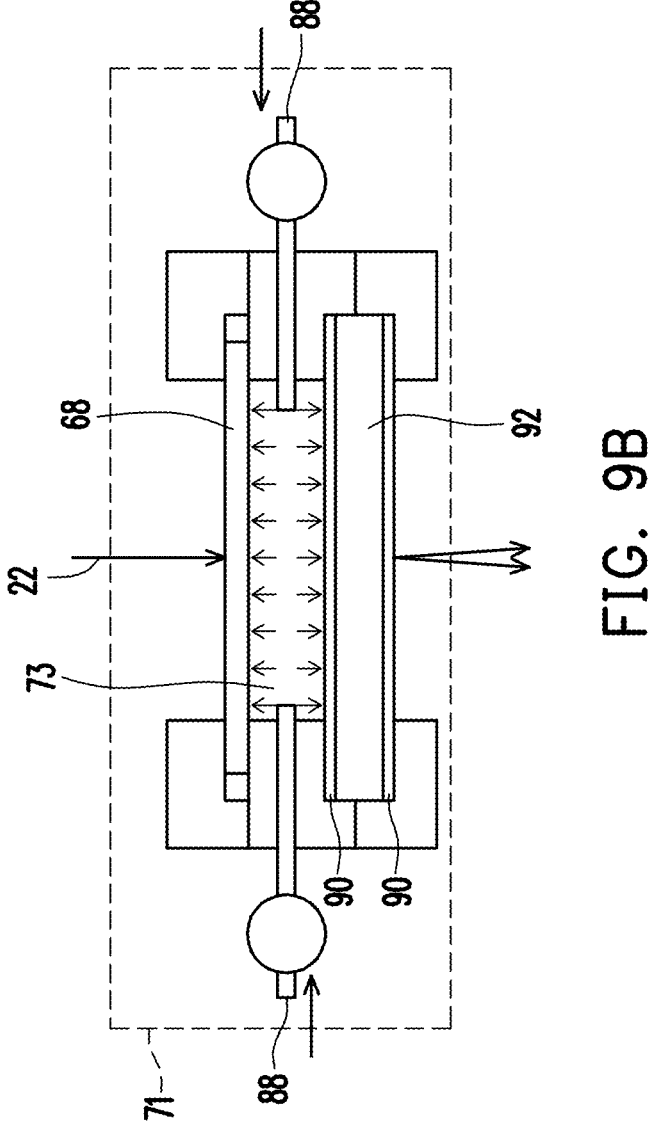

FIGS. 9A-9B illustrates an optical lithography system 600 in accordance with another embodiment. The optical lithography system 600 may be used to expose the dielectric layers of the front-side redistribution structure 136 (described previously in FIG. 7) and the back-side redistribution structure 106 (described previously in FIG. 2) and the photoresists used to pattern the metallization patterns of the front-side redistribution structure 136 and the back-side redistribution structure 106 to patterned light or other patterned energy sources used for patterning the dielectric layers and the photoresists (collectively referred to as target layers 318). Unless specified otherwise, like reference numerals in this embodiment (and subsequently discussed embodiments) represent like components in the embodiment shown in FIGS. 8A through 8B. Accordingly, the process steps and applicable materials may not be repeated herein. The optical lithography system may be step-and-repeat systems (e.g., steppers), step-and-scan systems (e.g., scanners), or the like.

The optical lithography system 600 includes a region 71 that comprises the photomask 68 and a pressurized chamber 73 (described subsequently in FIG. 9B) below the photomask 68. In FIG. 9A, the photomask 68 is shown as being aligned such that a patterned major surface of the photomask 68 is perpendicular to the force of gravity. The energy 22 (for example, in the form of light) from the energy source 54 is directed through the photomask 68 by the light pipe 55 and the turning mirror 64 in a direction that is perpendicular to the patterned major surface of the photomask 68. Energy 22 from the energy source 54 passes through photomask 68, and continues through the lens assembly 74. The lens assembly 74 may be a Wynne-Dyson projection lens with 1:1 imaging optics, or the like. In other embodiments, another type of projection lens may be used. An image of the photomask 68 pattern is then projected on to the target layers 318 on the wafer 86 by the lens assembly 74. The wafer 86 is supported by a wafer chuck 84, which is below the wafer 86.

Because the patterned major surface of the photomask 68 and the major surface of the wafer 86 are parallel to each other, the lens assembly 74 used to project an image of the photomask 68 pattern on to the target layers 318 on the wafer 86 may have a smaller focus than would be needed if the patterned major surface of the photomask 68 and the major surface of the wafer 86 are perpendicular to each other (for example, as described in FIGS. 8A-8B). As a result, the lens assembly 74 may comprise a smaller lens that would lead to reduced costs and may reduce the space occupied by the lens assembly 74. In addition, since the photomask 68 is shown being aligned such that a patterned major surface of the photomask 68 is perpendicular to the force of gravity rather than parallel to the force of gravity (for example, as described in FIGS. 8A-8B), the stress in the photomask 68 will be more uniform throughout the length of photomask 68 since the height of the photomask 68 is constant along the length of the photomask 68. Stress induced changes of refractive index along the length of the photomask 68 that are dependent on the height of photomask 68 will be reduced and this will lead to a more uniform transmittance of energy 22 through the photomask 68.

The wafer chuck 84 is supported by a translation stage 82 and a micropositioner 78. The translation stage 82 may include a motor, which allows the translation stage 82, to be movable, and capable of motion in three linear degrees of freedom (for example, X, Y and Z directions) in addition to allowing rotational movement. The micropositioner 78 allows the wafer chuck 84 to be positioned to finer limits than is possible by only using the translation stage 82 without the micropositioner 78. Translation stage 82 may allow movement by using a method that may include the use of air bearings 80, or the like. In other embodiments, the translation stage 82 may use other methods to allow movement. The translation stage 82 may be designed such that a movement of the translation stage 82 will correspond to a similar movement of the photomask 68, resulting in easier overlay control and less need for synchronization between the translation stage 82 and the photomask 68 than if the movements of the translation stage 82 and the photomask 68 were independent and did not correspond to each other (for example, as described in FIG. 8A-8B).

FIG. 9B illustrates the region 71 that comprises the photomask 68 and the pressurized chamber 73 below the photomask 68. The photomask 68 is shown as being aligned such that the patterned major surface of the photomask 68 is perpendicular to the force of gravity. The pressurized chamber 73 is a rigid enclosure and is formed between the photomask 68 and a substrate 92 below the photomask 68. The substrate 92 may comprise a transparent material (for example, glass, or the like). The substrate 92 may have a top surface and a bottom surface coated with an anti-reflection coating 90 (ARC). The energy 22 (for example, in the form of light) from the energy source 54 is directed through the photomask 68 in a direction that is perpendicular to the patterned major surface of the photomask 68 and continues through the substrate 92.

Two inlets 88 on opposite ends of the pressurized chamber 73 allow for the flowing of gas/gases into the pressurized chamber 73 to maintain a pressure that is higher than 760 torr, which is continuously measured in situ. Although two inlets 88 are illustrated in FIG. 9B, any number of inlets 88 may be used to flow the gas into the pressurized chamber 73. Each inlet 88 may have a gas valve which is used to control the flow of gas into the pressurized chamber 73. The gas being flowed into pressurized chamber 73 may comprise nitrogen, or the like. In other embodiments, the gas being flowed into the pressurized chamber may be an inert gas, or the like.

The pressurized gas in the pressurized chamber 73 exerts upwards pressure on the bottom surface of the photomask 68, and this may reduce the sagging at the center of the patterned major surface of photomask 68 that occurs due to gravitational effects. The flow of gas into pressurized chamber 73 can be controlled to completely remove the sagging at the center of the patterned major surface of the photomask 68 such that the bottom surface of the photomask 68 is completely level. In other embodiments, the flow of gas into pressurized chamber 73 can be controlled to enable the tuning of a curvature of a top surface of the photomask 68 from concave to convex. Due to the pressurized gas in the pressurized chamber 73, pressure will be exerted on the photomask 68 and the substrate 92 and each of the photomask 68 and the substrate 92 will accommodate stress due to this load, with the photomask 68 able to withstand a higher amount of stress before failure (for example, cracking or breaking) than the substrate 92. Because the flow of gas into pressurized chamber 73 can be controlled to reduce or completely remove the sagging at the center of the patterned major surface of the photomask 68, a curvature of the projected image by the lens assembly 74 is reduced which allows for a more uniform depth of focus, reduced image distortion, and for finer, more accurate patterning, which improves device performance, increases yield, and reduces manufacturing costs.

Figure 10:
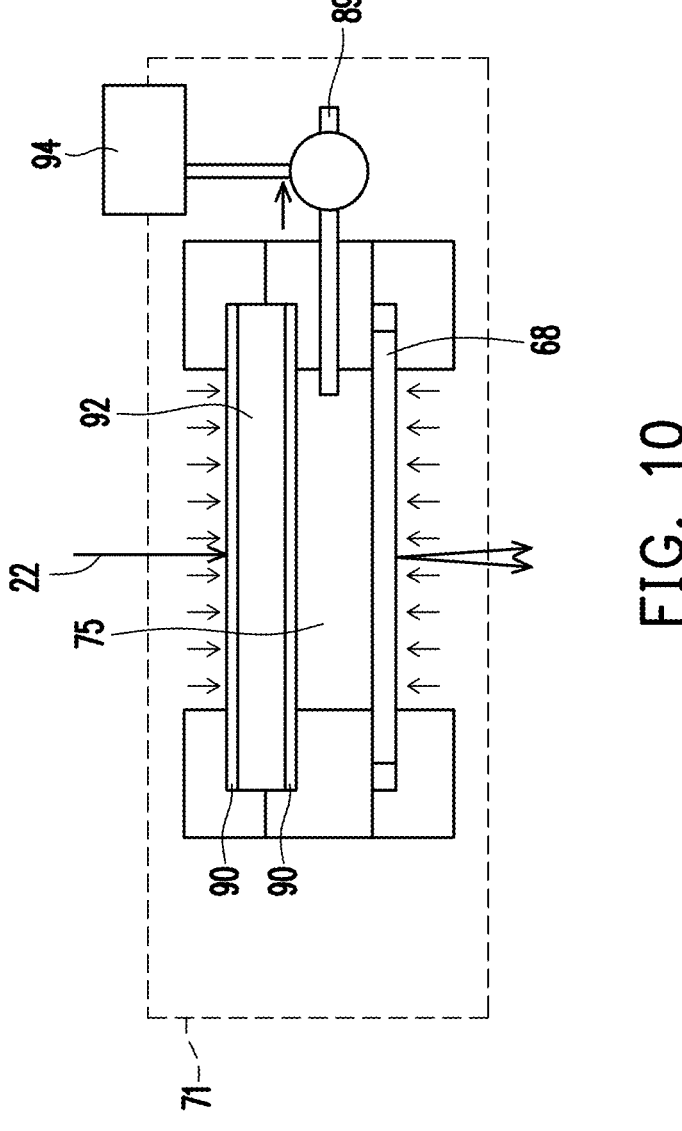

FIG. 10 illustrates an alternate embodiment of the optical lithography system 600. In FIG. 10, the region 71 comprises the photomask 68 and a vacuum chamber 75 above the photomask 68. The photomask 68 is shown as being aligned such that the patterned major surface of the photomask 68 is perpendicular to the force of gravity. The vacuum chamber 75 is formed between the photomask 68 and the substrate 92 above the photomask 68. The substrate 92 may comprise a transparent material (for example, glass, or the like). The substrate 92 may have a top surface and a bottom surface coated with an anti-reflection coating 90 (ARC). The energy 22 (for example, in the form of light) from the energy source 54 is directed through the substrate 92 and continues through the photomask 68 in a direction that is perpendicular to the patterned major surface of the photomask 68.

The vacuum chamber 75 is a rigid enclosure from which air and other gases are removed by a vacuum pump 94 through the outlet 89. The vacuum chamber 75 has a pressure that is maintained to be lower than 760 torr, and is continuously measured in situ. Although one outlet 89 is illustrated in FIG. 10, any number of outlets 89 may be used to remove the air or gases from the vacuum chamber 75. The outlet 89 may have a gas valve which is used to control the removal of air or gas from the vacuum chamber 75.

Because the vacuum chamber 75 is above the photomask 68, a top surface of the photomask 68 will experience a lower pressure than a lower surface of the photomask 68. Therefore, upwards pressure is exerted on the bottom surface of the photomask 68, and this may reduce the sagging at the center of the patterned major surface of photomask 68 that occurs due to gravitational effects. The amount of air or gas removed from vacuum chamber 75 can be controlled to completely remove the sagging at the center of the patterned major surface of the photomask 68 such that the bottom surface of the photomask 68 is completely level. In other embodiments, the amount of air or gas removed from vacuum chamber 75 can be controlled to enable the tuning of a curvature of a top surface of the photomask 68 from concave to convex. Due to the pressure in the vacuum chamber 75 being lower as compared to the pressure outside the vacuum chamber 75, pressure will be exerted on the photomask 68 and the substrate 92 and each of the photomask 68 and the substrate 92 will accommodate stress due to this load, with the photomask 68 able to withstand a higher amount of stress before failure (for example, cracking or breaking) than the substrate 92.

The use of the vacuum chamber 75 to reduce the sagging at the center of the patterned major surface of photomask 68 due to gravitational effects has some advantages. Because the pressure in the vacuum chamber 75 is maintained to be lower than 760 torr, the photomask 68 may comprise a pellicle over a surface of the photomask 68. A pressure maintained above 760 torr would increase a risk of cracks forming in the photomask 68, as well as being unsuitable for use with a photomask that comprises a pellicle. In addition, since air or gas is removed from the vacuum chamber 75, rather than being flowed into (for example, to form the pressurized chamber 73 described above in FIG. 10B) a risk of particle contamination and temperature changes due to incoming gases is reduced. Because the amount of air or gas removed from vacuum chamber 75 can be controlled to reduce or completely remove the sagging at the center of the patterned major surface of the photomask 68, a curvature of the projected image by the lens assembly 74 is reduced which allows for a more uniform depth of focus, reduced image distortion, and for finer, more accurate patterning, which improves device performance, increases yield, and reduces manufacturing costs.

Figure 11:
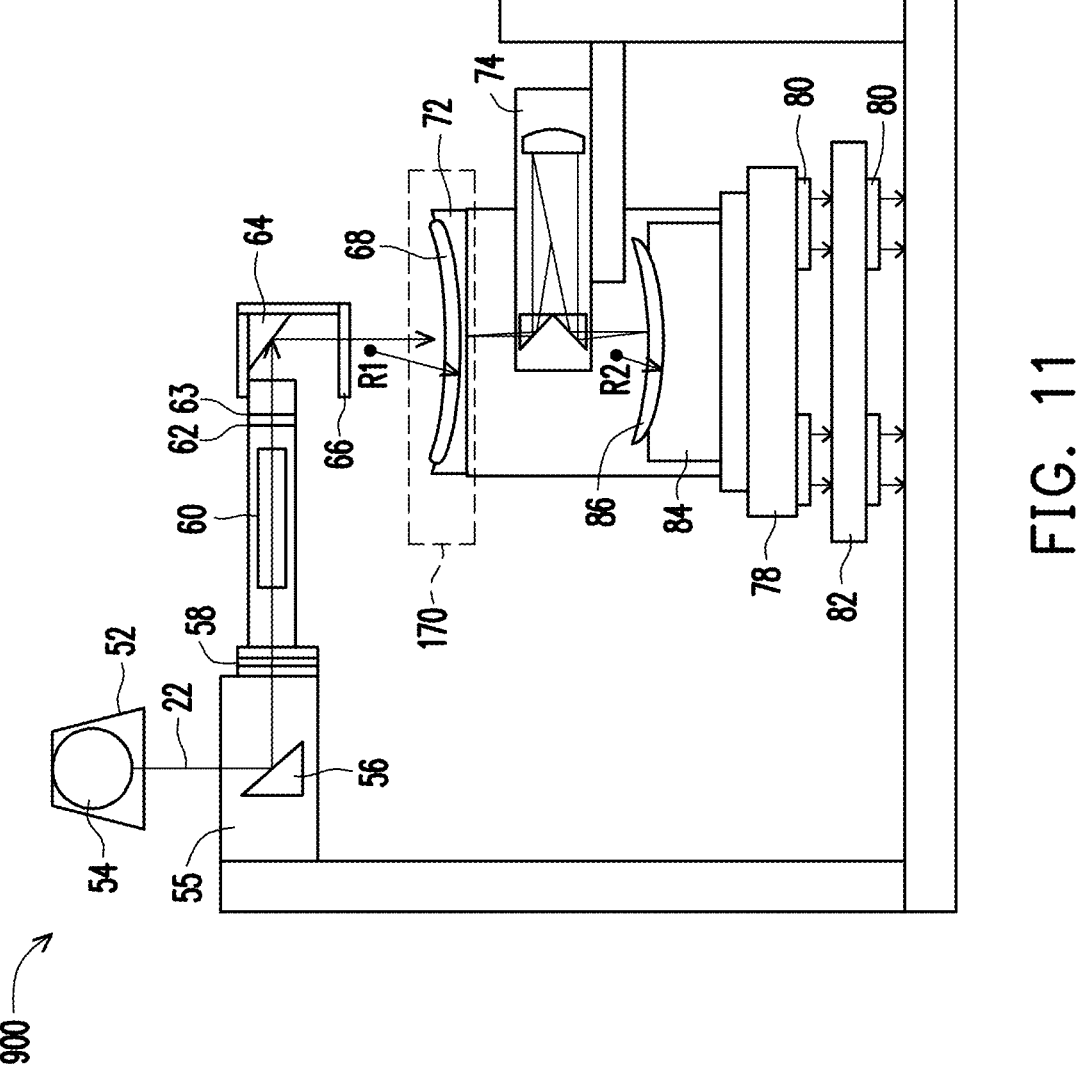

FIG. 11 illustrates an optical lithography system 900 in accordance with another embodiment. The optical lithography system 900 may be used to used to expose the dielectric layers of the front-side redistribution structure 136 (described previously in FIG. 7) and the back-side redistribution structure 106 (described previously in FIG. 2) and the photoresists used to pattern the metallization patterns of the front-side redistribution structure 136 and the back-side redistribution structure 106 to patterned light or other patterned energy sources used for patterning the dielectric layers and the photoresists (collectively referred to as target layers 318). Unless specified otherwise, like reference numerals in this embodiment represent like components in the embodiment shown in FIGS. 8A through 8B. Accordingly, the process steps and applicable materials may not be repeated herein. The optical lithography system may be step-and-repeat systems (e.g., steppers), step-and-scan systems (e.g., scanners), or the like.

The wafer chuck 84 is supported by a translation stage 82 and a micropositioner 78. The translation stage 82 may include a motor, which allows the translation stage 82, to be movable, and capable of motion in three linear degrees of freedom (for example, X, Y and Z directions) in addition to allowing rotational movement. The micropositioner 78 allows the wafer chuck 84 to be positioned to finer limits than is possible by only using the translation stage 82 without the micropositioner 78. Translation stage 82 may allow movement by using a method that may include the use of air bearings 80, or the like. In other embodiments, the translation stage 82 may use other methods to allow movement. The translation stage 82 may be designed such that a movement of the translation stage 82 will correspond to a similar movement of the photomask 68, resulting in easier overlay control and less need for synchronization between the translation stage 82 and the photomask 68 than if the movements of the translation stage 82 and the photomask 68 were independent and did not correspond to each other (for example, as described in FIG. 8A-8B).

During use, photomask 68 is supported only outside of the exposure area by the mask chuck 72. Because the photomask 68 is supported only on the outside of the exposure area, gravitational effects will cause the photomask 68 to bend and sag at the photomask center. The photomask 68 may sag such that a bottom surface of the photomask 68 has a curvature with a radius R1.

The energy 22 (for example, in the form of light) from the energy source 54 is directed through the photomask 68 by the light pipe 55 and the turning mirror 64 in a direction that is perpendicular to the patterned major surface of the photomask 68. Energy 22 from the energy source 54 passes through photomask 68, and continues through the lens assembly 74. The lens assembly 74 may be a Wynne-Dyson projection lens with 1:1 imaging optics, or the like. In other embodiments, another type of projection lens may be used. An image of the photomask 68 pattern is then projected on to the target layers 318 on the wafer 86 by the lens assembly 74. The wafer 86 may be supported by a wafer chuck 84, which is below the wafer 86. The wafer chuck 84 may be formed to have a curved chuck top surface with a radius of curvature R2. The radius of curvature R2 of the top surface of the wafer chuck 84 may substantially match the radius of curvature R1 of the bottom surface of the photomask 68. Due to the curved top surface of the wafer chuck 84, the wafer 86 may bend or warp to acquire the same curvature as the top surface of the wafer chuck 84 that supports it. Since this curvature substantially matches the curvature of the bottom surface of the photomask 68 that is caused by the sagging of the photomask 68, the curvature of the projected image by the lens assembly 74 substantially matches the curvature of a top surface of the wafer 86, which allows for a more uniform depth of focus along the top surface of the wafer 86 and minimizes a reduction in the usable depth of focus. This results in reduced image distortion, and for finer, more accurate patterning, which improves device performance, increases yield, and reduces manufacturing costs. Different types of photomasks 68 may bend and sag at the photomask center by different amounts such that bottom surfaces of the different photomasks 68 have different radius of curvatures R1. For each different type of photomask 68, a corresponding wafer chuck 84 may be formed to have a curved chuck top surface with a radius of curvature R2 that substantially matches the radius of curvature R1 of the photomask 68.

The use of a wafer chuck 84 with a curved top surface as a means to obtain a more uniform depth of focus along a top surface of the wafer 86 and to minimize a reduction in the usable depth of focus instead of using a pressurized chamber or a vacuum chamber (for example, as described in FIGS. 9A through 10) has an advantage in terms of not requiring the use of a substrate 92. This leads to reduced manufacturing costs.

By using various configurations of an optical lithography system as described in FIGS. 8A through 11, advantages can be achieved. For example, the use of an optical lithography system that includes a vertical mask chuck that aligns the photomask such that a patterned major surface of the photomask is parallel to the force of gravity may result in reduced sagging of the photomask due to gravitational effects. The use of an optical lithography system that includes a pressurized chamber below the photomask may allow for the use of gas pressure to tune the photomask surface curvature (e.g., tuning the photomask curvature from concave to convex) and reduced sagging of the photomask due to gravitational effects. The use of an optical lithography system that includes a vacuumed chamber above the photomask, may allow the use of a vacuumed environment to tune the photomask surface curvature (e.g., tuning the photomask curvature from concave to convex) and reduce sagging of the photomask due to gravitational effects. In addition, the use of an optical lithography system may include using a curved wafer chuck that matches the sagging of the photomask, which reduces image distortion of a projected image on a wafer surface of a wafer that is on the curved wafer chuck. When an optical lithography system does not incorporate one of the various configurations described in FIGS. 8A through 11, undesirable effects may result, such as a reduced usable depth of focus and image distortion.

Figure 12:
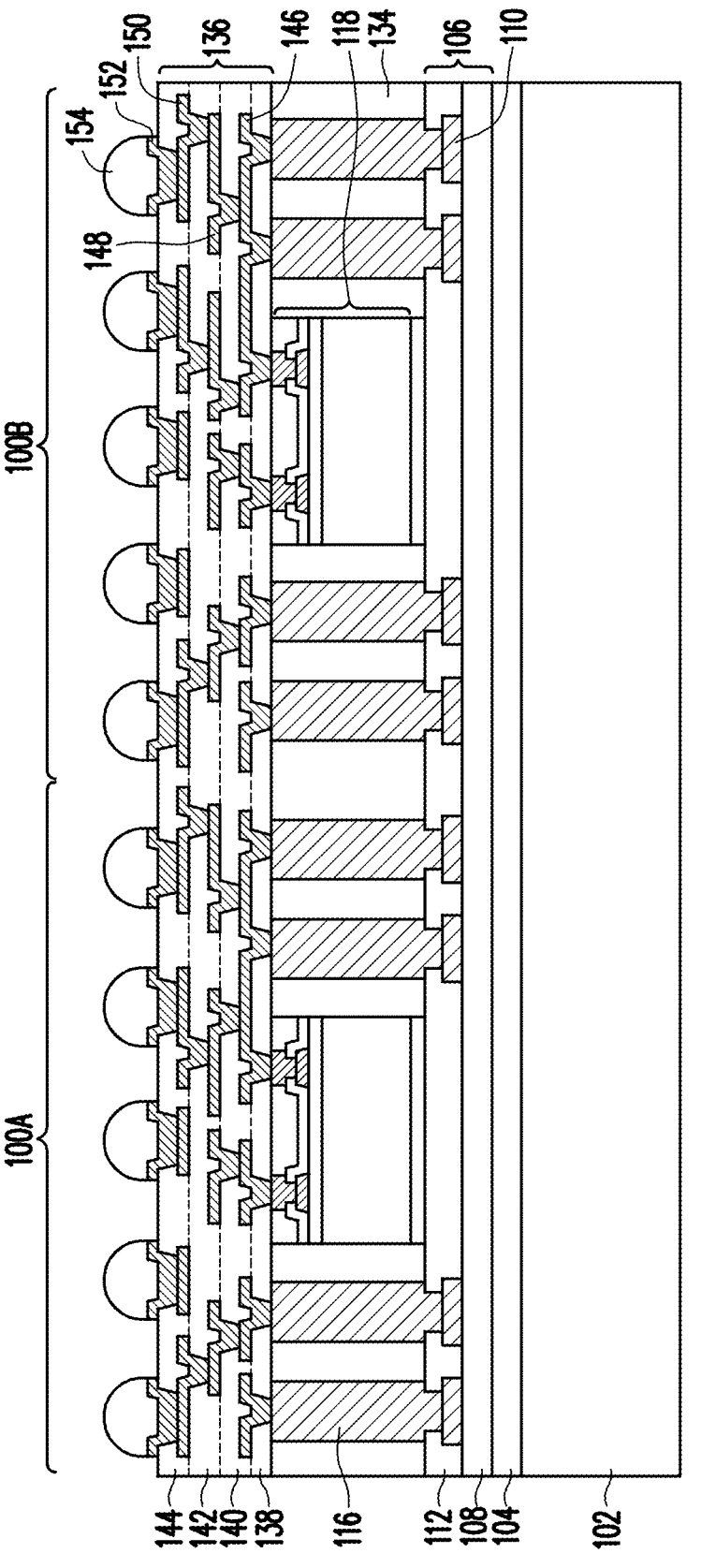
FIGS. 12 through 15 illustrate cross-sectional views of intermediate steps during a process for further forming a first package and for attaching other package structures to the first package, in accordance with some embodiments.

In FIG. 12, UBMs 152 are formed on and extending through the sixth dielectric layer 144 and conductive connectors 154 are formed on the UBMs 152. As an example to form the UBMs 152, the sixth dielectric layer 144 may be patterned to form openings (not separately illustrated) exposing portions of the fourth metallization pattern 150. The patterning may be by an acceptable process, such as by exposing the sixth dielectric layer 144 to light when the sixth dielectric layer 144 is a photo-sensitive material or by etching using, for example, an anisotropic etch. If the sixth dielectric layer 144 is a photo-sensitive material, the sixth dielectric layer 144 can be developed after the exposure. The openings for the UBMs 152 may be wider than the openings for the conductive via portions of the second metallization pattern 146, the third metallization pattern 148, and the fourth metallization pattern 150. A seed layer (not separately illustrated) is formed over the sixth dielectric layer 144 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 152. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 152. In embodiments where the UBMs 152 are formed differently, more photoresist and patterning steps may be utilized.

Conductive connectors 154 are then formed over the UBMs 152. The conductive connectors 154 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 154 may include a conductive material such as solder, copper, aluminum, gold, nickel, silver, palladium, tin, the like, or a combination thereof. In some embodiments, the conductive connectors 154 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 154 comprise metal pillars (such as a copper pillar) formed by a sputtering, printing, electro plating, electroless plating, CVD, or the like. The metal pillars may be solder free and have substantially vertical sidewalls. In some embodiments, a metal cap layer (not separately illustrated) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
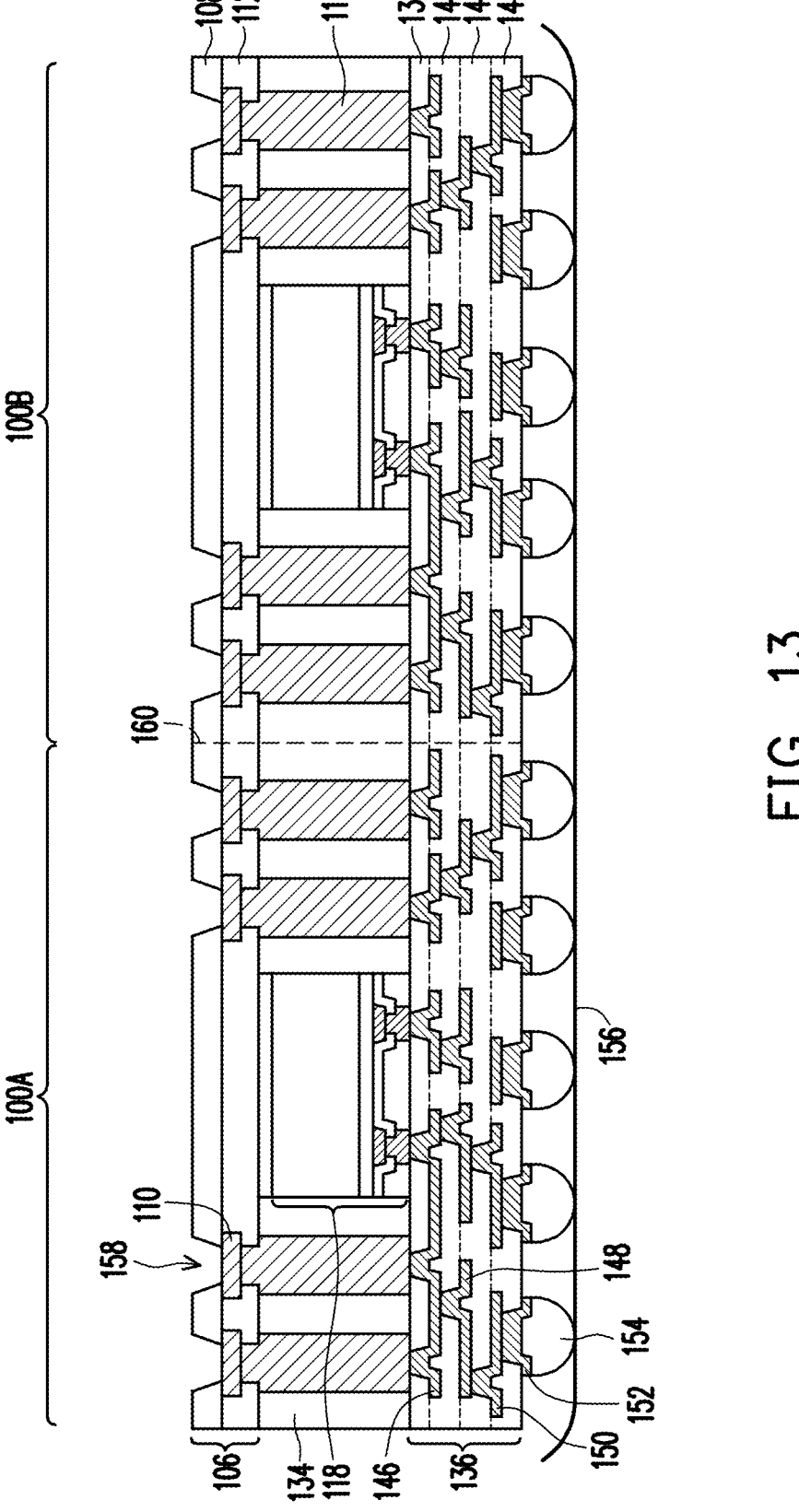

In FIG. 13, a carrier substrate de-bonding is performed to detach (de-bond) the carrier substrate 102 from the backside redistribution structure 106, e.g., the first dielectric layer 108. Features remaining after the de-bonding (e.g., in the first package region 100A and the second package region 100B) form the first packages 200. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape 156. Further, openings 158 are formed through the first dielectric layer 108 to expose portions of the first metallization pattern 110. The openings 158 may be formed, for example, using laser drilling, etching, or the like.

Figure 14:
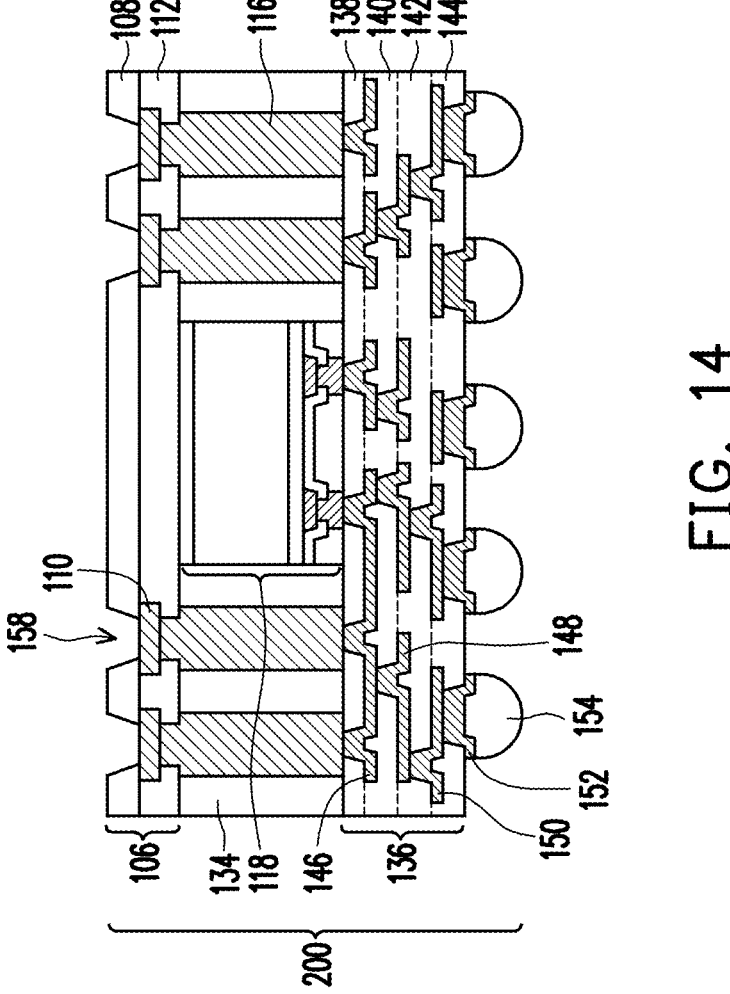

In FIG. 14, a singulation process is performed by sawing along scribe line regions 160 illustrated in FIG. 13, e.g., between the adjacent first package region 100A and the second package region 100B, resulting in a singulated first package 200. The sawing singulates the first package region 100A from the second package region 100B. The singulation results in the first package 200, which may be from one of the first package region 100A or the second package region 100B, being singulated. The first package 200 may also be referred to as an integrated fanout (InFO) package 200 or a first package 200.

Figure 15:
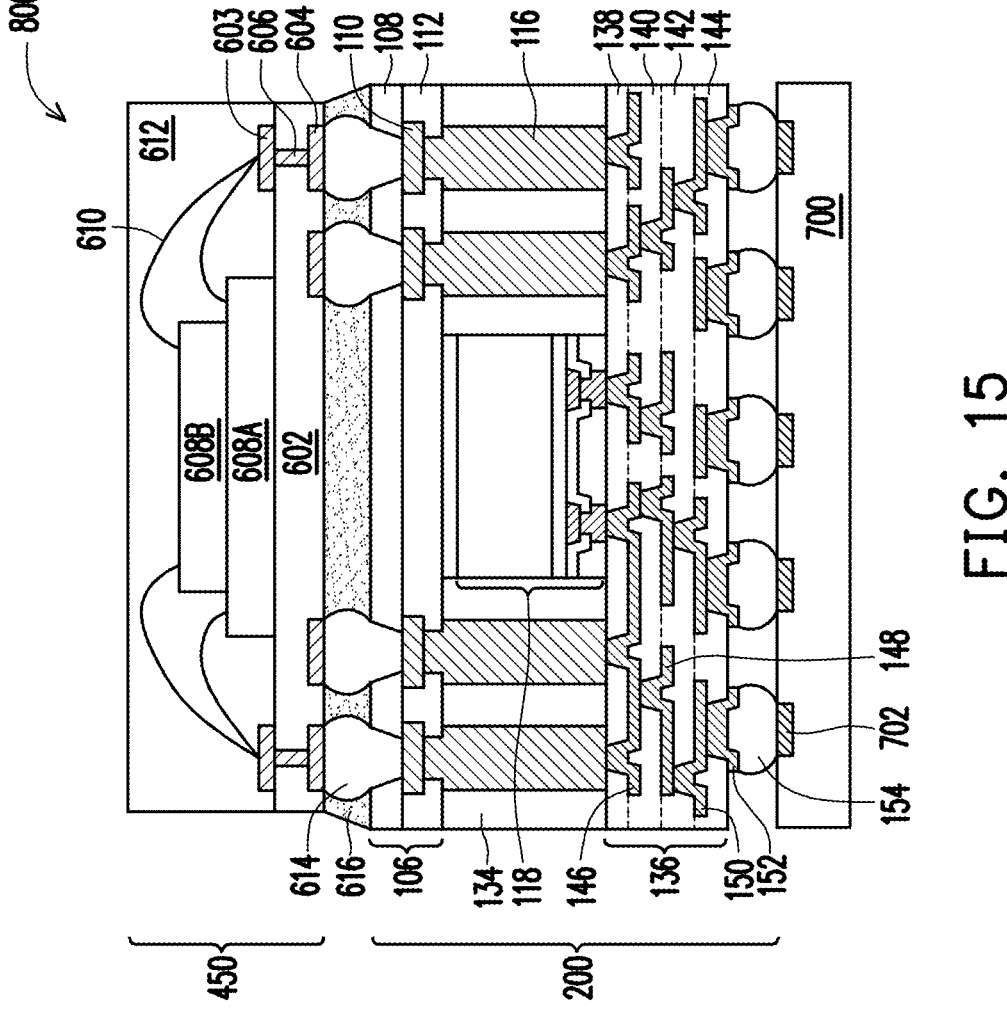

FIG. 15 illustrates a semiconductor package 800 including the first package 200, a second package 450, and a package substrate 700. The second package 450 includes a substrate 602 and one or more stacked dies 608 (e.g., a first die 608A and a second die 608B) coupled to the substrate 602. The substrate 602 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 602 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 602 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films may be used for substrate 602.

The substrate 602 may include active and passive devices (not separately illustrated). As one of ordinary skill in the art will recognize, a wide variety of devices such as transistors, capacitors, resistors, combinations of these, and the like may be used to generate the structural and functional requirements of the design for the second package 450. The devices may be formed using any suitable methods.

The substrate 602 may also include metallization layers (not separately illustrated) and through vias 606. The metallization layers may be formed over the active and passive devices and are designed to connect the various devices to form functional circuitry. The metallization layers may be formed of alternating layers of dielectric (e.g., layers of low-k dielectric material) and conductive material (e.g., copper) with vias interconnecting the layers of conductive material and may be formed through any suitable process (such as deposition, damascene, dual damascene, or the like). In some embodiments, the substrate 602 is substantially free of active and passive devices.

The substrate 602 may have first bond pads 603 on a first side the substrate 602 to couple to the stacked dies 608, and second bond pads 604 on a second side of the substrate 602, the second side being opposite the first side of the substrate 602, to couple to the conductive connectors 614. In some embodiments, the first bond pads 603 and the second bond pads 604 are formed by forming recesses (not separately illustrated) into dielectric layers (not separately illustrated) on the first and second sides of the substrate 602. The recesses may be formed to allow the first bond pads 603 and the second bond pads 604 to be embedded into the dielectric layers. In other embodiments, the recesses are omitted as the first bond pads 603 and the second bond pads 604 may be formed on the dielectric layer. In some embodiments, the first bond pads 603 and the second bond pads 604 include a thin seed layer (not separately illustrated) made of copper, titanium, nickel, gold, palladium, the like, or a combination thereof. The conductive material of the first bond pads 603 and the second bond pads 604 may be deposited over the thin seed layer. The conductive material may be formed by an electro-chemical plating process, an electroless plating process, CVD, ALD, PVD, the like, or a combination thereof. In an embodiment, the conductive material of the first bond pads 603 and the second bond pads 604 is copper, tungsten, aluminum, silver, gold, the like, or a combination thereof.

In an embodiment, the first bond pads 603 and the second bond pads 604 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first bond pads 603 and the second bond pads 604. Any suitable materials or layers of material that may be used for the first bond pads 603 and the second bond pads 604 are fully intended to be included within the scope of the current application. In some embodiments, the through vias 606 extend through the substrate 602 and couple at least one first bond pad 603 to at least one second bond pad 604.

In the illustrated embodiment, the stacked dies 608 are coupled to the substrate 602 by wire bonds 610, although other connections may be used, such as conductive bumps. In an embodiment, the stacked dies 608 are stacked memory dies. For example, the stacked dies 608 may include low-power (LP) double data rate (DDR) memory modules, such as LPDDR1, LPDDR2, LPDDR3, or the like memory modules.

In some embodiments, the stacked dies 608 and the wire bonds 610 may be encapsulated by a molding material 612. The molding material 612 may be molded on the stacked dies 608 and the wire bonds 610, for example, using compression molding. In some embodiments, the molding material 612 is a molding compound, a polymer, an epoxy, a silicon oxide filler material, the like, or a combination thereof. A curing step may be performed to cure the molding material 612, wherein the curing may be a thermal curing, a UV curing, the like, or a combination thereof. In some embodiments, the stacked dies 608 and the wire bonds 610 are buried in the molding material 612, and after the curing of the molding material 612, a planarization step, such as a grinding, is performed to remove excess portions of the molding material 612 and provide a substantially planar surface for the second packages 450.

After the second packages 450 are formed, the second packages 450 are bonded to the first packages 200 by way of conductive connectors 614, the second bond pads 604, and the first metallization pattern 110. In some embodiments, the stacked dies 608 may be coupled to the integrated circuit die 118 through the wire bonds 610, the first bond pads 603 and the second bond pads 604, the through vias 606, the conductive connectors 614, and the through vias 116.

The conductive connectors 614 may be similar to the conductive connectors 154 described above and the description is not repeated herein, although the conductive connectors 614 and 154 need not be the same. In some embodiments, before bonding the conductive connectors 614, the conductive connectors 614 are coated with a flux (not separately illustrated), such as a no-clean flux. The conductive connectors 614 may be dipped in the flux or the flux may be jetted onto the conductive connectors 614. In another embodiment, the flux may be applied to the surfaces of the first metallization patterns 110.

In some embodiments, the conductive connectors 614 may have an epoxy flux (not separately illustrated) formed thereon before they are reflowed with at least some of the epoxy portion of the epoxy flux remaining after the second package 450 is attached to the first package 200. This remaining epoxy portion may act as an underfill to reduce stress and protect the joints resulting from the reflowing the conductive connectors 614. In some embodiments, an underfill 616 may be formed between the second package 450 and the first package 200 and surrounding the conductive connectors 614. The underfill 616 may be formed by a capillary flow process after the second package 450 is attached or may be formed by a suitable deposition method before the second package 450 is attached.

The bonding between the second package 450 and the first package 200 may be a solder bonding or a direct metal-to-metal (such as a copper-to-copper or tin-to-tin) bonding. In an embodiment, the second package 450 is bonded to the first package 200 by a reflow process. During this reflow process, the conductive connectors 614 are in contact with the second bond pads 604 and the first metallization patterns 110 to physically and electrically couple the second package 450 to the first package 200. After the bonding process, an IMC (not separately illustrated) may form at the interface of the first metallization patterns 110 and the conductive connectors 614 and also at the interface between the conductive connectors 614 and the second bond pads 604 (not separately illustrated).

The semiconductor package 800 includes the first package 200 and the second package 450 mounted to a package substrate 700. The package substrate 700 may be referred to a package substrate 700. The second package 450 is mounted to the package substrate 700 using the conductive connectors 154.

The package substrate 700 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 700 may be a SOI substrate. Generally, an SOI substrate includes a layer of a semiconductor material such as epitaxial silicon, germanium, silicon germanium, SOI, SGOI, or combinations thereof. The package substrate 700 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films may be used for package substrate 700.

The package substrate 700 may include active and passive devices (not separately illustrated). As one of ordinary skill in the art will recognize, a wide variety of devices such as transistors, capacitors, resistors, combinations of these, and the like may be used to generate the structural and functional requirements of the design for the semiconductor package 800. The devices may be formed using any suitable methods.

The package substrate 700 may also include metallization layers and vias (not separately illustrated) and bond pads 702 over the metallization layers and vias. The metallization layers may be formed over the active and passive devices and are designed to connect the various devices to form functional circuitry. The metallization layers may be formed of alternating layers of dielectric (e.g., layers of low-k dielectric material) and conductive material (e.g., copper) with vias interconnecting the layers of conductive material and may be formed through any suitable process (such as deposition, damascene, dual damascene, or the like). In some embodiments, the package substrate 700 is substantially free of active and passive devices.

In some embodiments, the conductive connectors 154 can be reflowed to attach the first package 200 to the bond pads 702. The conductive connectors 154 electrically and/or physically couple the package substrate 700, including metallization layers in the package substrate 700, to the first package 200.

The conductive connectors 154 may have an epoxy flux (not separately illustrated) formed thereon before they are reflowed with at least some of the epoxy portion of the epoxy flux remaining after the first package 200 is attached to the package substrate 700. This remaining epoxy portion may act as an underfill to reduce stress and protect the joints resulting from the reflowing the conductive connectors 154. In some embodiments, an underfill (not separately illustrated) may be formed between the first package 200 and the package substrate 700 and surrounding the conductive connectors 154. The underfill may be formed by a capillary flow process after the first package 200 is attached or may be formed by a suitable deposition method before the first package 200 is attached.

The embodiments of the present disclosure have some advantageous features. The use of disclosed methods may include various configurations of an optical lithography system to support a photomask that is used with the optical lithographic system. The disclosed methods may allow the tuning of a photomask surface curvature (e.g., tuning the photomask curvature from concave to convex), reduce or minimize sagging of the photomask due to gravitational effects and minimize a reduction in usable depth of focus and image distortion as a result of the sagging of the photomask due to gravitational effects. In addition, the disclosed methods include various configurations for an optical lithography system that help to maintain a uniform depth of focus, and allow for finer, more accurate patterning, which improves device performance and increases yield.

In accordance with an embodiment, an apparatus includes an energy source; a support platform for holding a wafer; an optical path extending from the energy source to the support platform; and a photomask aligned such that a patterned major surface of the photomask is parallel to the force of gravity, where the optical path passes through the photomask, where the patterned major surface of the photomask is perpendicular to a topmost surface of the support platform. In an embodiment, the photomask is supported by a mask chuck that includes a vacuum. In an embodiment, the mask chuck is capable of vertical motion. In an embodiment, the mask chuck is capable of motion in three linear degrees of freedom. In an embodiment, the support platform includes a motor for moving the support platform. In an embodiment, the apparatus further includes a light pipe, where a length of the light pipe is parallel to the patterned major surface of the photomask.

In accordance with an embodiment, a lithography system includes an optical system configured to receive radiation transmitted through a patterned mask and direct it to a surface of a wafer; and a mask system including: the patterned mask; and a transparent substrate, where the radiation is transmitted through the transparent substrate before being directed to the surface of the wafer, the mask system being configured to adjust a pressure between the patterned mask and the transparent substrate to tune a curvature of a major surface of the patterned mask. In an embodiment, the major surface of the patterned mask is parallel to a major surface of the transparent substrate. In an embodiment, the transparent substrate includes glass. In an embodiment, the transparent substrate has a top surface and a bottom surface coated with an anti-reflection coating. In an embodiment, the patterned mask is above the transparent substrate. In an embodiment, the lithography system further includes one or more gas inlets that allow gas to flow between the patterned mask and the transparent substrate. In an embodiment, the patterned mask is below the transparent substrate. In an embodiment, the lithography system further includes a vacuum pump that removes air from between the patterned mask and the transparent substrate. In an embodiment, the patterned mask is able to withstand a higher amount of stress before failure than the transparent substrate.

In accordance with an embodiment, a method includes generating energy using an energy source; tuning a curvature of a major surface of a photomask by adjusting a pressure between the photomask and a transparent substrate; and directing the energy along an optical path to expose a surface of a target layer to the energy, where directing the energy along the optical path includes the energy passing through the transparent substrate and the photomask, where the major surface of the photomask is parallel to a major surface of the transparent substrate. In an embodiment, the tuning of the curvature of the major surface of the photomask includes flowing a gas between the transparent substrate and the photomask. In an embodiment, the pressure between the transparent substrate and the photomask is maintained to be higher than 760 torr. In an embodiment, the tuning of the curvature of the major surface of the photomask includes removing air from between the transparent substrate and the photomask. In an embodiment, the pressure between the transparent substrate and the photomask is maintained to be lower than 760 torr.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a radiation source;
a support platform for holding a wafer;
a photomask disposed over the support platform, wherein the photomask is configured to receive radiation from the radiation source, and allow the radiation to be transmitted through the photomask and onto a surface of the wafer; and
a pressurized chamber below the photomask, wherein a bottom surface of the photomask and a topmost surface of a substrate define the pressurized chamber, wherein gas in the pressurized chamber exerts a pressure on a single surface of the photomask, the pressure being an upward pressure on the bottom surface of the photomask.

2. The apparatus of claim 1, wherein a horizontal width between outermost sidewalls of the photomask is greater than a horizontal width of the pressurized chamber at the widest point of the pressurized chamber.

3. The apparatus of claim 2, wherein the pressurized chamber has a pressure that is higher than atmospheric pressure.

4. The apparatus of claim 2, wherein the substrate comprises a transparent material.

5. The apparatus of claim 4, wherein the substrate has a top surface and a bottom surface coated with an anti-reflection coating (ARC).

6. The apparatus of claim 1, further comprising a light pipe, wherein a length of the light pipe is parallel to a patterned major surface of the photomask.

7. The apparatus of claim 6, wherein the light pipe comprises a cold mirror, a shutter, and a condenser assembly.

8. An apparatus comprising:
a radiation source;
a wafer chuck for holding a wafer;
an optical path extending from the radiation source to the wafer chuck;
a photomask aligned over the wafer, wherein the optical path passes through the photomask and onto a surface of the wafer;
a pressurized chamber disposed between the photomask and a substrate; and
a translation stage configured to support the wafer chuck, wherein the translation stage comprises a motor, and wherein the translation stage and the photomask are configured to have their movements be synchronized to each other.

9. The apparatus of claim 8, wherein the substrate comprises a transparent material.

10. The apparatus of claim 9, wherein the substrate comprises glass.

11. The apparatus of claim 8, wherein the photomask is configured to withstand a higher amount of stress before failure than the substrate.

12. The apparatus of claim 8, further comprising a lens assembly that is disposed between the photomask and the wafer chuck.

13. The apparatus of claim 12, wherein the lens assembly is a Wynne-Dyson projection lens with 1:1 imaging optics.

14. The apparatus of claim 8, wherein the substrate has a top surface and a bottom surface with an anti-reflection coating (ARC).

15. The apparatus of claim 8, wherein the photomask is above and overlaps the substrate.

16. An apparatus comprising:
a radiation source;
a wafer chuck for supporting a wafer;
a photomask disposed over the wafer chuck, wherein the photomask is configured to receive radiation from the radiation source, and allow the radiation to be transmitted through the photomask and onto a surface of the wafer; and
a rigid enclosure below the photomask, wherein the rigid enclosure is disposed between the photomask and a substrate, and wherein the rigid enclosure has a pressure that is higher than atmospheric pressure.

17. The apparatus of claim 16, further comprising a light pipe used to direct the radiation from the radiation source through the photomask to the wafer chuck, the light pipe being between the radiation source and the photomask.

18. The apparatus of claim 17, wherein the light pipe has a longitudinal axis extending in a direction perpendicular with the force of gravity.

19. The apparatus of claim 17, wherein the light pipe comprises a cold mirror, a shutter, and a condenser assembly.

20. The apparatus of claim 17, wherein the light pipe further comprises a filter insertion configured to allow the insertion of different filters into the light pipe.

\* \* \* \* \*